US010199492B2

(12) United States Patent
Lui

(10) Patent No.: US 10,199,492 B2
(45) Date of Patent: Feb. 5, 2019

(54) FOLDED CHANNEL TRENCH MOSFET

(71) Applicant: Alpha and Omega Semiconductor Incorporated, Sunnyvale, CA (US)

(72) Inventor: Sik Lui, Sunnyvale, CA (US)

(73) Assignee: ALPHA AND OMEGA SEMICONDUCTOR INCORPORATED, Sunnyvale, CA (US)

(*) Notice: Subject to any disclaimer, the term of this patent is extended or adjusted under 35 U.S.C. 154(b) by 2 days.

(21) Appl. No.: 15/364,827

(22) Filed: Nov. 30, 2016

(65) Prior Publication Data
US 2018/0151720 A1    May 31, 2018

(51) Int. Cl.
| | |
|---|---|
| *H01L 29/78* | (2006.01) |
| *H01L 21/266* | (2006.01) |
| *H01L 21/768* | (2006.01) |
| *H01L 23/528* | (2006.01) |
| *H01L 29/08* | (2006.01) |
| *H01L 29/10* | (2006.01) |
| *H01L 29/66* | (2006.01) |

(52) U.S. Cl.
CPC ........ *H01L 29/7813* (2013.01); *H01L 21/266* (2013.01); *H01L 21/76883* (2013.01); *H01L 21/76897* (2013.01); *H01L 23/5283* (2013.01); *H01L 29/0865* (2013.01); *H01L 29/1095* (2013.01); *H01L 29/66734* (2013.01)

(58) Field of Classification Search
CPC ........... H01L 29/66734; H01L 29/7813; H01L 29/1095; H01L 29/4236; H01L 29/13091; H01L 29/66727; H01L 29/66666; H01L 29/7827
See application file for complete search history.

(56) References Cited

U.S. PATENT DOCUMENTS

| | | | |
|---|---|---|---|
| 6,509,233 B2 | 1/2003 | Chang et al. | |
| 6,538,300 B1 | 3/2003 | Goldberger et al. | |
| 6,621,143 B2 | 9/2003 | Goldberger et al. | |
| 7,605,425 B2 | 10/2009 | Bhalla et al. | |
| 7,683,369 B2 | 3/2010 | Ho et al. | |
| 7,800,169 B2 | 9/2010 | Bhalla et al. | |
| 8,004,063 B2 | 8/2011 | Goldberger et al. | |
| 8,357,973 B2 | 1/2013 | Lui et al. | |
| 8,394,702 B2 | 3/2013 | Tai et al. | |

(Continued)

FOREIGN PATENT DOCUMENTS

| | | | | |
|---|---|---|---|---|
| JP | 2000-323712 | * | 11/2000 | ............. H01L 29/78 |
| TW | 200943449 A | | 10/2009 | |

(Continued)

OTHER PUBLICATIONS

Hisamoto et al. in "A Folded-Channel MOSFET for Deep-Sub-Tenth Micron Era," 1032 IEDM (1998).

(Continued)

*Primary Examiner* — Khiem D Nguyen
(74) *Attorney, Agent, or Firm* — JDI Patent; Joshua Isenberg; Robert Pullman

(57) ABSTRACT

A trench MOSFET device includes a body, region and source region that undulate along a channel width direction of the MOSFET device such that the body region and source region have variations in depth along the channel width direction. The undulations increase a channel width of the MOSFET device.

6 Claims, 28 Drawing Sheets

(56) References Cited

U.S. PATENT DOCUMENTS

| | | |
|---|---|---|
| 8,431,470 B2 | 4/2013 | Lui et al. |
| 8,431,989 B2 | 4/2013 | Bhalla et al. |
| 8,445,370 B2 | 5/2013 | Lui et al. |
| 8,580,667 B2 | 11/2013 | Lui et al. |
| 8,643,135 B2 | 2/2014 | Bobde et al. |
| 8,669,613 B2 | 3/2014 | Lui et al. |
| 8,753,935 B1 | 6/2014 | Bobde et al. |
| 8,759,908 B2 | 6/2014 | Lui et al. |
| 8,828,857 B2 | 9/2014 | Lui et al. |
| 8,829,603 B2 | 9/2014 | Lui et al. |
| 8,896,131 B2 | 11/2014 | Bhalla et al. |
| 8,901,571 B2* | 12/2014 | Nakano ............... H01L 29/1095 257/77 |
| 8,907,416 B2 | 12/2014 | Tai et al. |
| 8,933,506 B2 | 1/2015 | Bobde et al. |
| 8,946,816 B2 | 2/2015 | Bobde et al. |
| 8,946,942 B2 | 2/2015 | Lui et al. |
| 8,956,940 B2 | 2/2015 | Lui et al. |
| 8,963,233 B2 | 2/2015 | Bhalla et al. |
| 8,963,240 B2 | 2/2015 | Bhalla et al. |
| 8,980,716 B2 | 3/2015 | Lui et al. |
| 9,024,378 B2 | 5/2015 | Bhalla et al. |
| 9,136,060 B2 | 9/2015 | Goldberger et al. |
| 9,136,380 B2 | 9/2015 | Yilmaz et al. |
| 9,171,917 B2 | 10/2015 | Bobde et al. |
| 9,190,512 B2 | 11/2015 | Lee et al. |
| 9,214,545 B2 | 12/2015 | Tai et al. |
| 9,230,957 B2 | 1/2016 | Lui et al. |
| 9,246,347 B2 | 1/2016 | Lui et al. |
| 9,269,805 B2 | 2/2016 | Lui |
| 9,324,858 B2 | 4/2016 | Bhalla et al. |
| 9,484,452 B2 | 11/2016 | Bobde et al. |
| 2004/0113201 A1* | 6/2004 | Bhalla ............. H01L 21/823487 257/329 |
| 2005/0280133 A1 | 12/2005 | Luo et al. |
| 2006/0289916 A1* | 12/2006 | Park ...................... H01L 29/165 257/296 |
| 2008/0265241 A1 | 10/2008 | Foerster |
| 2009/0085103 A1* | 4/2009 | Hille ................... H01L 29/0619 257/330 |
| 2009/0206924 A1 | 8/2009 | Zeng et al. |
| 2010/0078682 A1* | 4/2010 | Ngai ................... H01L 21/6835 257/192 |
| 2010/0321840 A1* | 12/2010 | Bobde ................ H01L 27/0266 361/56 |
| 2011/0049580 A1 | 3/2011 | Lui et al. |
| 2011/0180909 A1 | 7/2011 | Yoshikawa |
| 2013/0105886 A1 | 5/2013 | Lui et al. |
| 2013/0126966 A1 | 5/2013 | Lui et al. |
| 2013/0224919 A1* | 8/2013 | Ding ................... H01L 29/4236 438/270 |
| 2015/0060936 A1 | 3/2015 | Ding et al. |
| 2015/0084117 A1* | 3/2015 | Bobde ............... H01L 29/66734 257/328 |
| 2015/0311295 A1 | 10/2015 | Lee et al. |
| 2016/0329426 A1 | 11/2016 | Lee et al. |

FOREIGN PATENT DOCUMENTS

| | | |
|---|---|---|
| TW | 200945584 A | 11/2009 |
| WO | 2010008617 A1 | 1/2010 |

OTHER PUBLICATIONS

Office Action dated May 16, 2018 for Taiwanese patent application No. 10720440610.

* cited by examiner

500

US 10,199,492 B2

FOLDED CHANNEL TRENCH MOSFET

FIELD OF THE DISCLOSURE

This disclosure relates to integrated circuits and more specifically to integrated circuit devices having field effect transistors (FETs).

BACKGROUND OF INVENTION

Field Effect Transistors (FETs) are semiconductor transistor devices in which a voltage applied to an electrically insulated gate controls flow of current between source and drain. One example of a FET is a metal oxide semiconductor FET (MOSFET), in which a gate electrode is isolated from a semiconducting body region by an oxide insulator. When a voltage is applied to the gate, the resulting electric field generated penetrates through the oxide and creates an "inversion layer" or "channel" at the semiconductor-insulator interface. The inversion layer provides a channel through which current can pass. Varying the gate voltage modulates the conductivity of this layer and thereby controls the current flow between drain and source. MOSFETs may have different structures. In one example, MOSFETs may have a planar structure having gate, source and drain on the top of the device, with current flow taking place in a path parallel to the surface. In another example, MOSFETS may have a vertical structure in which a trench filled with doped polysilicon extends from the source to the drain with sidewalls and a floor that are each lined with a layer of thermally grown silicon dioxide. Such a trench MOSFET transistor allows less constricted current flow and, consequently, provides lower values of specific on-resistance.

FETs are useful in many power switching applications. In one particular configuration useful in a battery protection circuit module (PCM), two FETs are arranged in a back-to-back configuration with their drains connected together in a floating configuration. FIG. 1A schematically illustrates such a configuration. FIG. 1B shows use of such a device 100 in conjunction with a Battery Protection Circuit Module PCM 102, battery 104, and a load or charger 106. In this example, the gates of the charge and discharge FETs 120 and 130, respectively, are driven independently by a controller integrated circuit (IC) 110. This configuration allows for current control in both directions: charger to battery and battery to load. In normal charge and discharge operation both MOSFETs 120 and 130 are ON (i.e., conducting). During an overcharge or charge over-current condition of the battery 104, the controller IC 110 turns the charge FET 120 off and the discharge FET 130 on. During an overdischarge or discharge over-current condition, the controller IC 110 turns the charge FET 120 on and the discharge FET 130 off.

It is within this context that embodiments of the present invention arise.

BRIEF DESCRIPTION OF THE DRAWINGS

Objects and advantages of aspects of the present disclosure will become apparent upon reading the following detailed description and upon reference to the accompanying drawings in which.

DESCRIPTION OF THE SPECIFIC EMBODIMENTS

Introduction

Figure 1A:
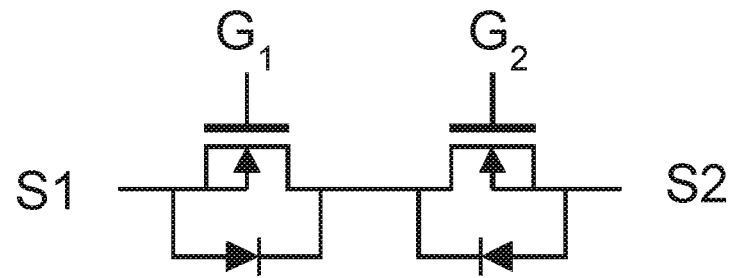
FIG. 1A is a schematic diagram of a conventional switching circuit having two back-to-back MOSFETs.
Figure 1B:
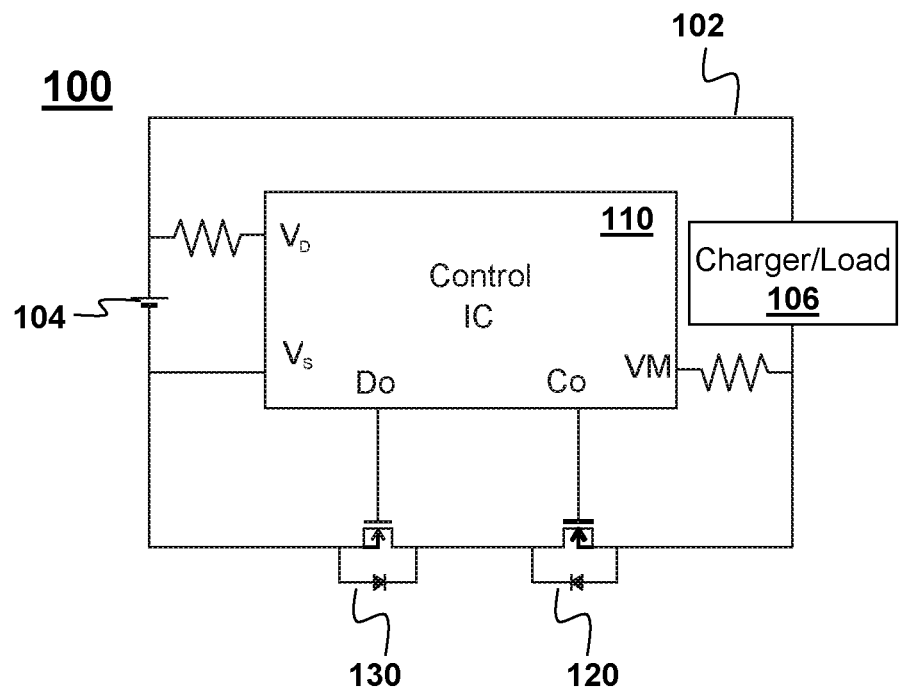
FIG. 1B is a schematic diagram of a conventional battery Protection Circuit Module (PCM).
Figure 2A:
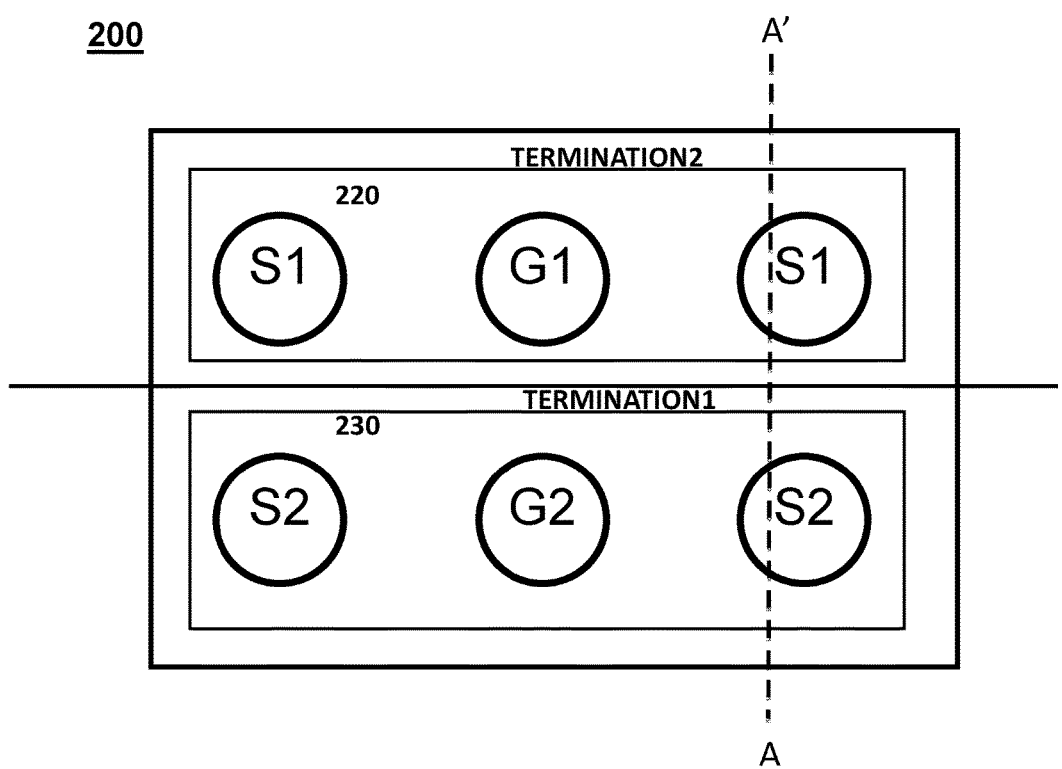
FIG. 2A is a plan view schematic diagram of a conventional switching device having two back-to-back MOSFETs in a side-by-side configuration.

FIG. 2A shows a conventional layout for a device 200 having two fully isolated vertical MOSFETs, 220 and 230, respectively, with a separate termination and channel stop for each of them. A relatively large amount of dead space is required between MOSFET 1 and MOSFET 2 to provide separate termination regions and channel stops.

Figure 2B:
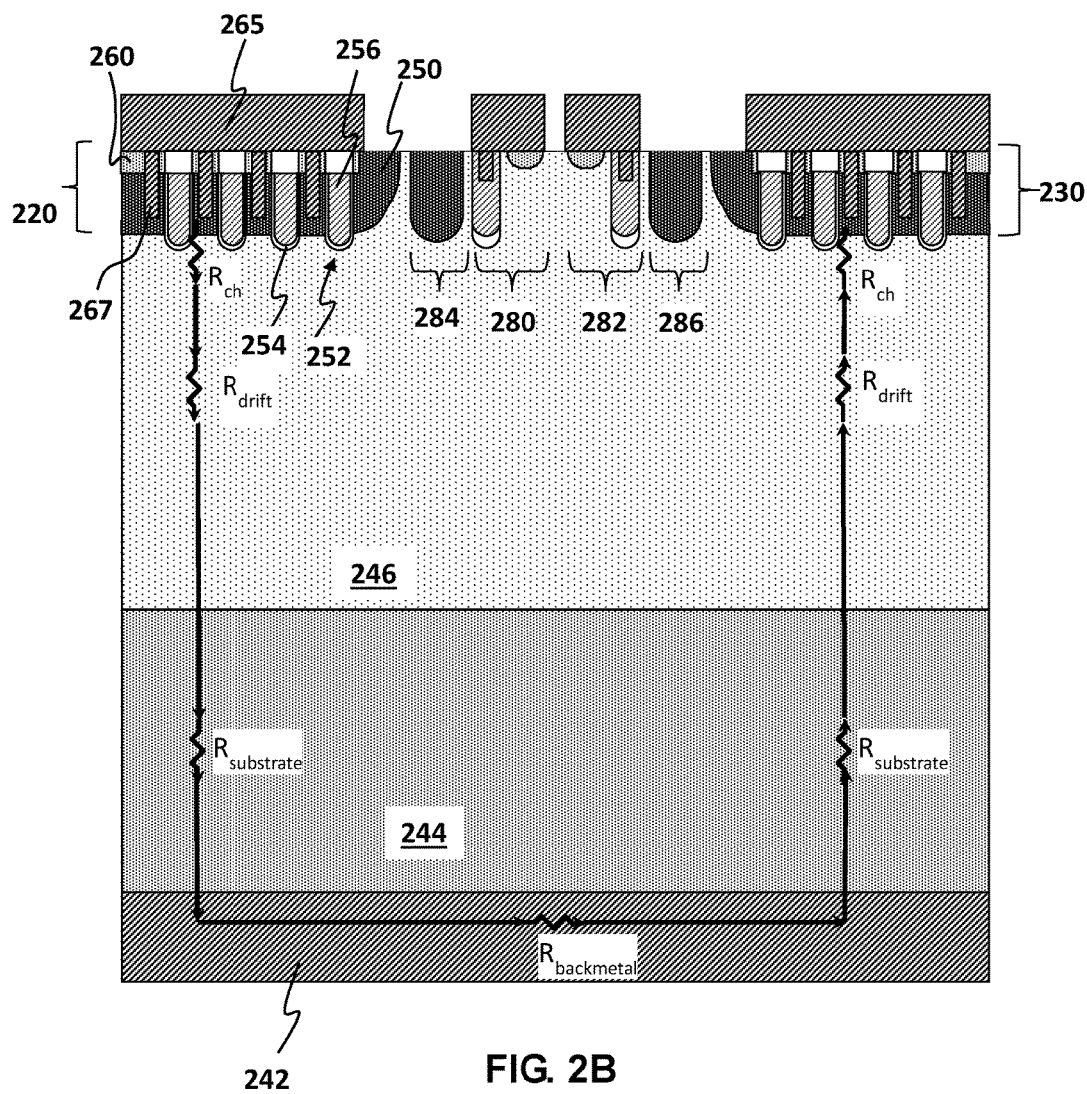
FIG. 2B is a cross-sectional schematic diagram of the conventional switching circuit of FIG. 2A taken along line A-A' of FIG. 2A.

A cross-sectional view of the device 200 of FIG. 2A is shown in FIG. 2B. Each vertical MOSFET 220/230 includes a plurality of active device cells formed in a lightly-doped epitaxial layer 246 grown on a more heavily doped substrate 244. In this example, a heavily doped (e.g., N+) substrate 244 acts as a drain and the drains of the two MOSFETs 220 and 230 are electrically connected via back metal 242 formed on a backside of the substrate 244. Active devices are formed in a lesser doped epitaxial drift layer 246 of the same conductivity type (e.g., N-type) grown on the front side of the substrate 244. Body regions 250 of opposite conductivity to the substrate 244 and epitaxial region 246 (e.g., P-type) are formed in portions of the epitaxial layer 246. Trenches 252 are formed in the epitaxial layer 246 and then lined with an insulator 254 (e.g., an oxide). Electrically isolated gate electrodes 256, e.g., made of polycrystalline silicon (polysilicon, also known as poly) are disposed in the trenches 252. Heavily doped (e.g., N+) source regions 260 of the same conductivity type as the substrate 244 are formed proximate the trenches 252. External electrical contact to the source regions is made via a source metal layer 265 and vertical source contacts 267. The channel stops 280, 282 are formed using insulated electrodes similar to the gate electrodes that are shorted to the epitaxial drift region by source-type conductivity regions in the epitaxial region. The termination also includes guard rings 284, 286 formed by body-type conductivity regions.

A key characteristic of the device is the source-to-source resistance with both MOSFETs 220 and 230 turned on. It is desirable to make this resistance as small as possible. The total source-source resistance $R_{ss}$ is given by:

$$R_{ss} = 2R_{ch} + 2R_{drift} + R_{backmetal} + 2R_{substrate},$$

where $R_{ch}$ is the resistance of the conductive channel through the source 260 and body regions 250 when the gates are turned on, $R_{drift}$ is the resistance of the epitaxial layer 246, $R_{backmetal}$ is the resistance of the back metal 242, and $R_{substrate}$ is the resistance of the substrate 244. Since the channel resistance ($R_{ch}$) is one of the largest components of the total source-source resistance $R_{ss}$, it is desirable to make the resistance of the conductive channel ($R_{ch}$) as small as possible.

Figure 3:
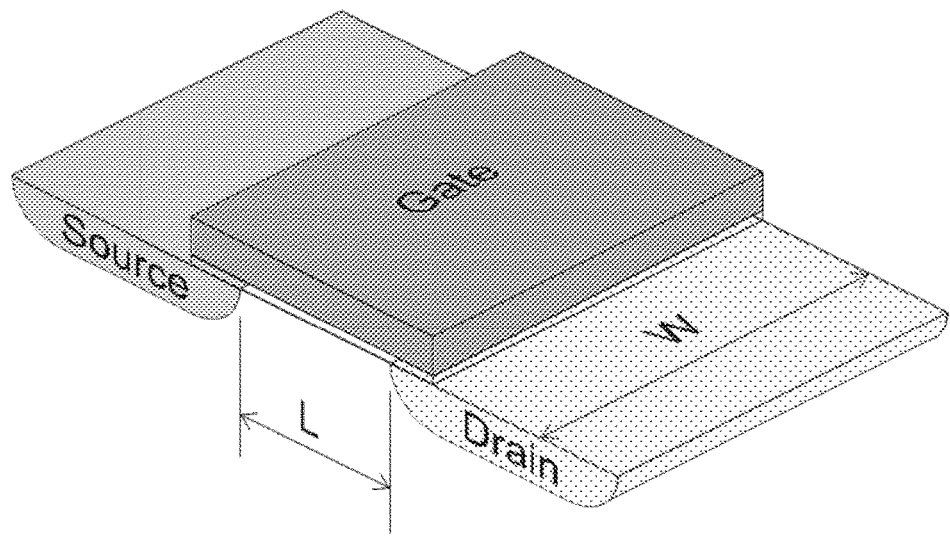
FIG. 3 is a schematic diagram of a conventional planar MOSFET device.

FIG. 3 is a schematic diagram of a conventional planar MOSFET showing its channel length (L) and channel width (W). As known by those skilled in the art of semiconductor devices, channel resistance ($R_{ch}$) is directly proportional to the channel length (L) and inversely proportional to the channel width (W). For a given die size, channel resistance ($R_{ch}$) is also inversely proportional to the channel density. In order to reduce channel resistance ($R_{ch}$), the conventional approach is to reduce the cell pitch of the MOSFETs and thus increasing the channel density. However, there is a limit as to the distance between a feature in one cell and another in an adjacent cell due to manufacturing capabilities.

FinFET

Figure 4:
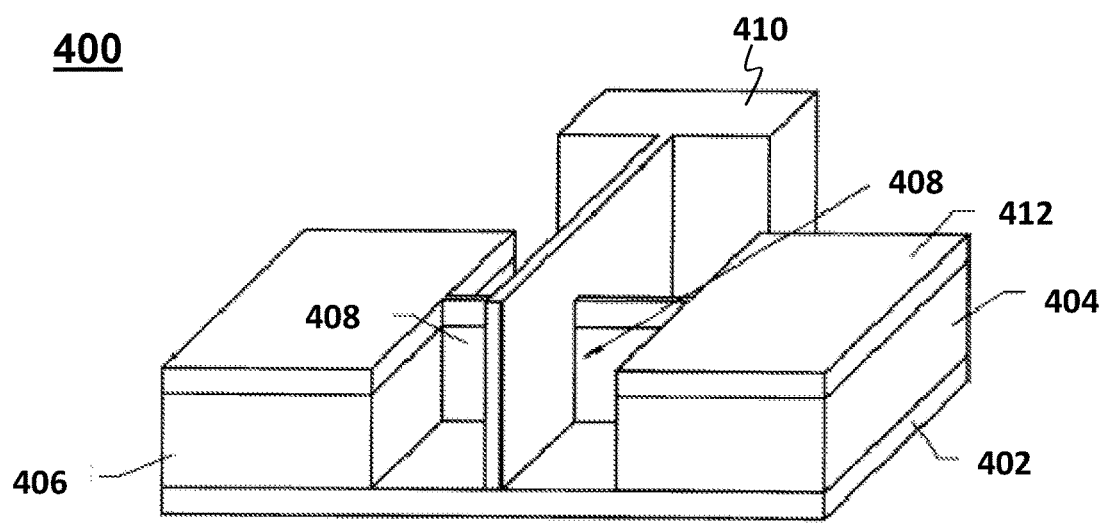
FIG. 4 is a schematic diagram of a conventional FinFET device.
Figure 5:
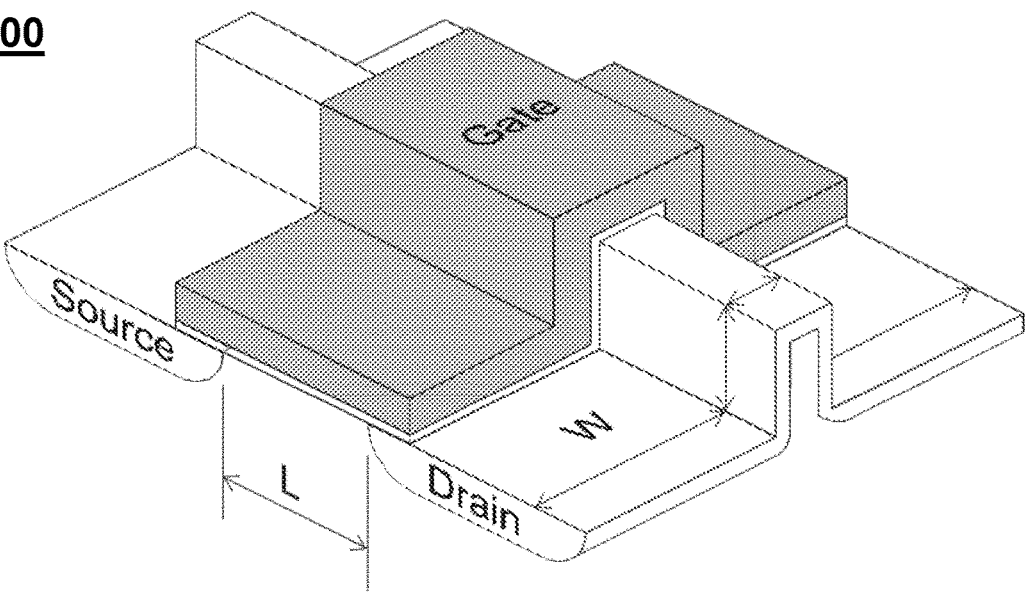
FIG. 5 is a schematic diagram of a folded channel planar MOSFET device.

Fin Field Effect Transistor ("FinFET") is a type of non-planar transistors built on a silicon-on-insulator substrate. Hisamoto et al. in "A Folded-Channel MOSFET for Deep-Sub-Tenth Micron Era,"1032 IEDM (1998), introduces a FinFET structure which includes a vertical ultra-thin silicon fin, two gates self-aligned with the source and drain, a raised source and drain to reduce parasitic resistance, and a quasi-planar structure. FIG. 4 illustrates in perspective an improved FinFET transistor 400. The transistor 400 is constructed from a silicon body 402 that includes a drain region 404, a source region 406 and a fin-shaped channel region 408 connected between the drain region 404 and the source region 406. The drain 404, source 406 and the fin-channel regions 408 are covered by a dielectric layer 412. A gate structure 410 extends across and wrapped over the fin-shaped channel 408 such that the gate structure interface with three sides of the channel 408. The structure of the FinFET 400 provides improved electrical control over the channel conduction and it helps reduce leakage current levels and overcomes some other short-channel effects. In addition, it is noted that the channel width of a FinFET may be approximately double the height of the channel region fin by wrapping the gate over the channel 408. Since then, few methods have been proposed to increase the channel width of a planar MOSFET by folding the device such as the device 500 shown in FIG. 5.

Folded Channel Trench MOSFET to Reduce $R_{ss}$

Figure 6:
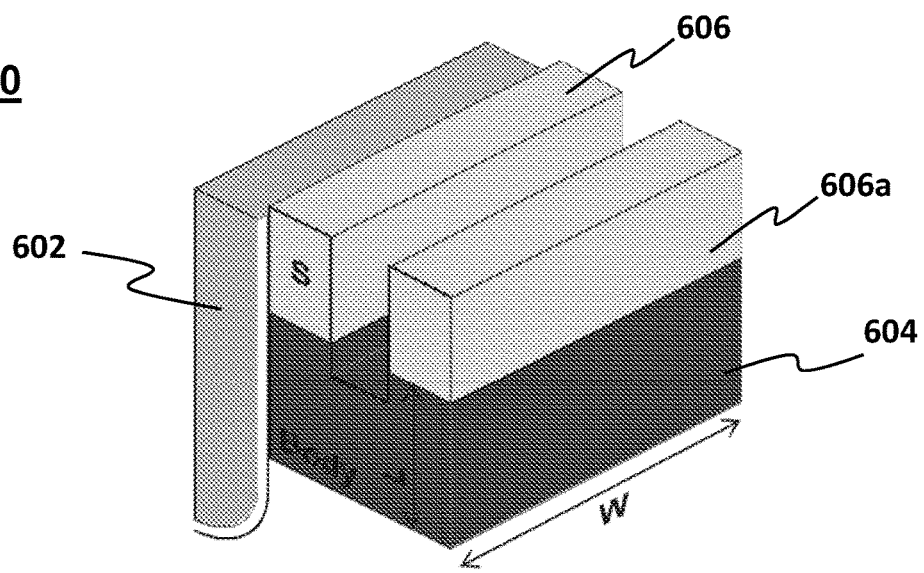
FIG. 6 is a schematic diagram of a conventional trench MOSFET device.

To appreciate the advantages of a folded channel MOSFET in accordance with aspects of the present disclosure it is useful to understand a conventional trench MOSFET. FIG. 6 illustrates portions of a conventional trench MOSFET device 600. The trench MOSFET 600 includes a gate electrode 602, a body region 604 and a source region 606 provided over a substrate (not shown). It should be noted that although only one gate electrode 602 is shown in FIG. 6, another gate electrode may be provided next to the side of the source region 606a. The channel length (L) of the trench MOSFET 600 is between the bottom of the source region 606 and the bottom of the body region 604 (i.e., top of the substrate) and the channel width (W) is the third dimension of the cross-section as indicated. In order to improve total source-source resistance $R_{ss}$ by reducing channel resistance ($R_{ch}$) of the trench MOSFET 600, it is desirable to reduce its channel length (L) or increase its channel width (W).

Figure 7:
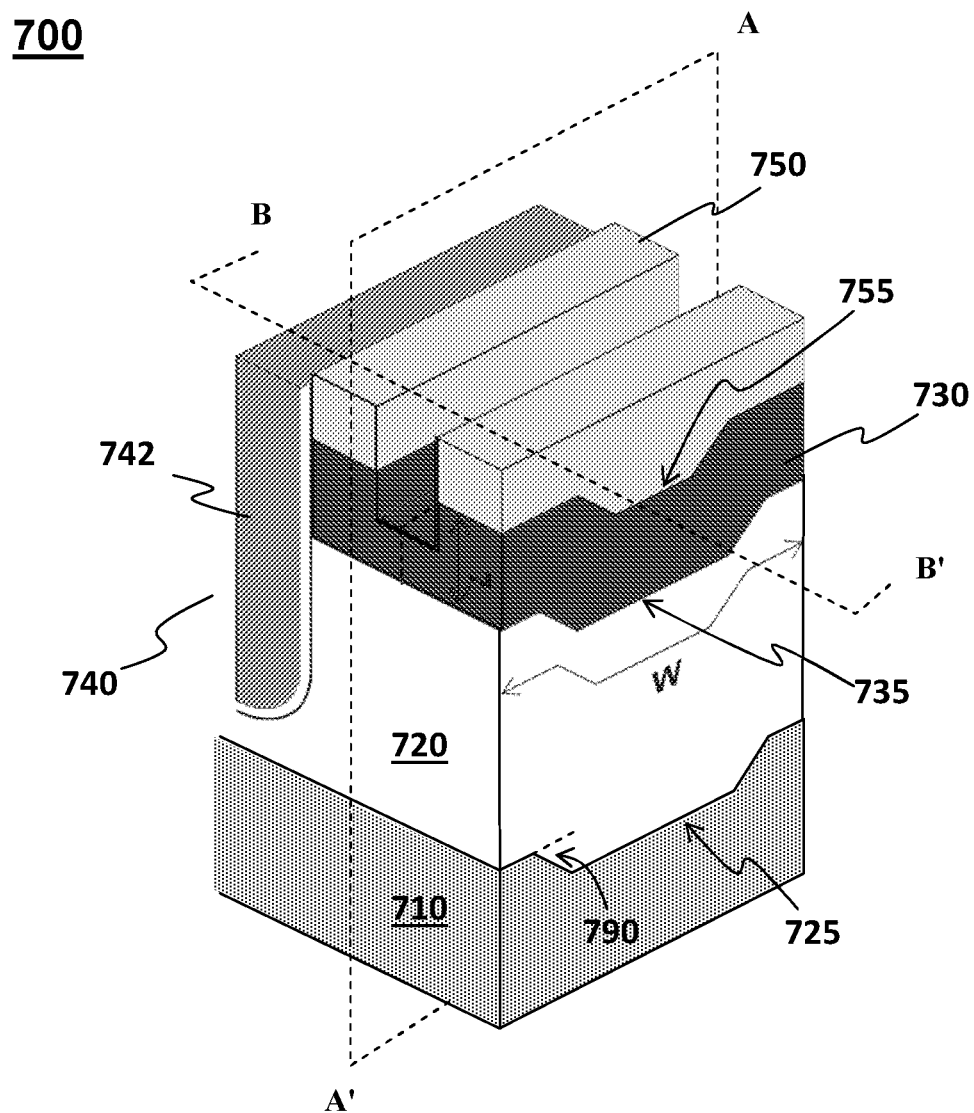
FIG. 7 is a schematic diagram of a trench MOSFET device according to aspects of the present disclosure.

Aspects of the present disclosure achieve low channel resistance by "folding" the channel region of a trench MOSFET. FIG. 7 is a schematic diagram of a trench MOSFET device 700 according to aspects of the present disclosure. It should be noted that the device 700 may have a plurality of active device cells though only portions are shown in FIG. 7. The trench MOSFET device 700 includes a lightly doped epitaxial layer of a first conductivity type 720 (e.g., N−) formed on top of a heavily doped semiconductor substrate 710 of the same conductivity type (e.g., N+). A body region 730 of a second conductivity opposite to the substrate 710 and the epitaxial layer 720 (e.g., P type) is formed in portions of the lightly doped epitaxial layer 720. A gate trench 740 filled with an electrically isolated gate electrodes 742 (e.g., polysilicon) extends into the lightly doped epitaxial layer 720. A heavily doped source region 750 of the same conductivity type as the substrate (e.g., N+) is formed proximate to the trenches within the body region 730.

As shown in FIG. 7, the epitaxial layer 720 has an undulation 725 (or a recessed portion) along a channel width direction of the device 700 such that the epitaxial layer 720 has variations in depth along the channel width direction at the interface between the epitaxial layer 720 and the substrate 710. In addition, the body region 730 has an undulation 735 along the channel width direction above the undulation 725 such that the body region 730 has variations in depth along the channel width direction at the interface between the body region 730 and the epitaxial layer 720. The source region 750 has an undulation 755 along the channel width direction above the undulations 725 and 735 such that the source region 750 has variations in depth along the channel width direction at the interface between the source region 750 and the body region 730. As shown, the undulations 725, 735 and 755 each has a recessed bottom surface and tapered sides. With introduction of the undulations 725, 735 and 755, the channel of the device 700 is "folded" as shown in FIG. 7, and thus increasing channel width and reducing channel resistance. In one example, the channel resistance may be reduced 16.3% when the angle 790 of the tapered sides of the undulations 725, 735 and 755 is at about 45 degree. It is noted that the sharper the angle 790, the better the reduction improvement on channel resistance ($R_{ch}$). By way of example and not by way of limitation, the tapered sides of the undulations 725, 735 and 755 may be at an angle between about 25 degrees and about 90 degrees.

Figure 8A:
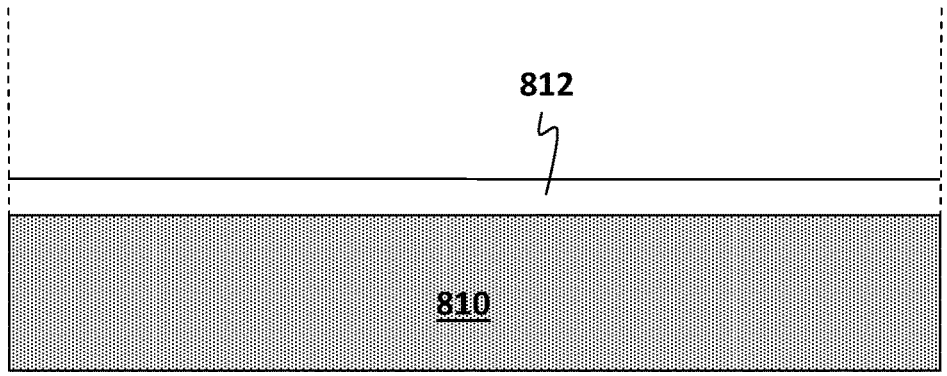
FIGS. 8AA'-29AA' are cross-sectional views illustrating a process of fabricating a trench MOSFET in the A-A' cross-section in FIG. 7.
Figure 8B:
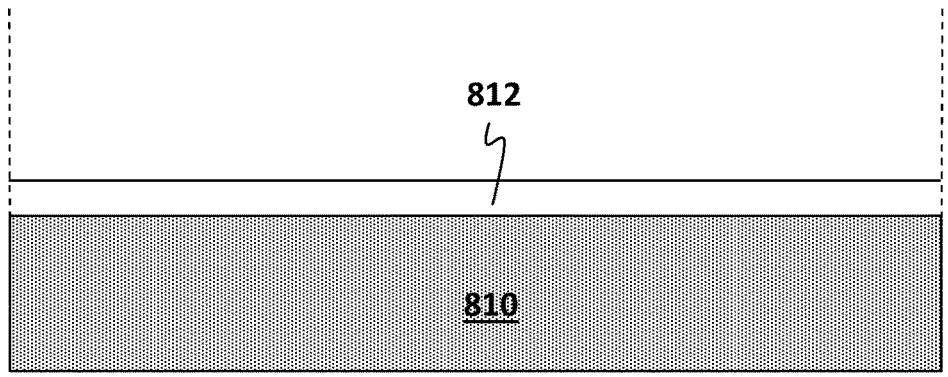
FIGS. 8BB'-29BB' are cross-sectional views illustrating a process of fabricating a trench MOSFET in the B-B' cross-section in FIG. 7
Figure 9A:
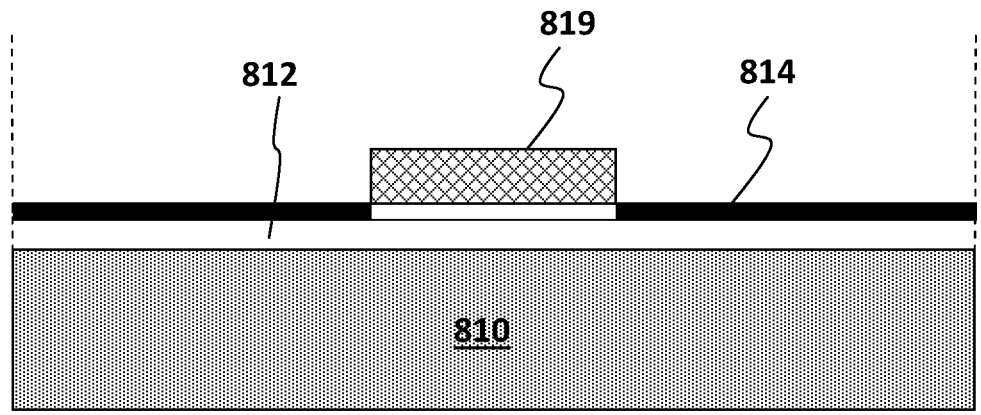
Figure 9B:
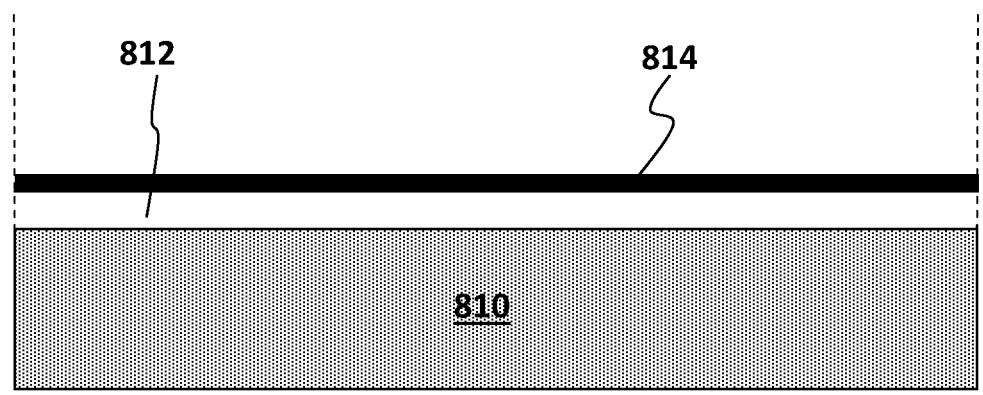
Figure 10A:
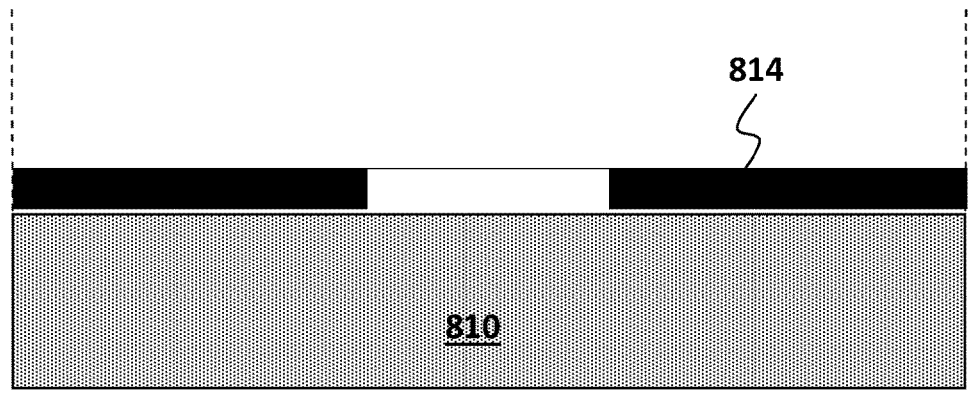
Figure 10B:
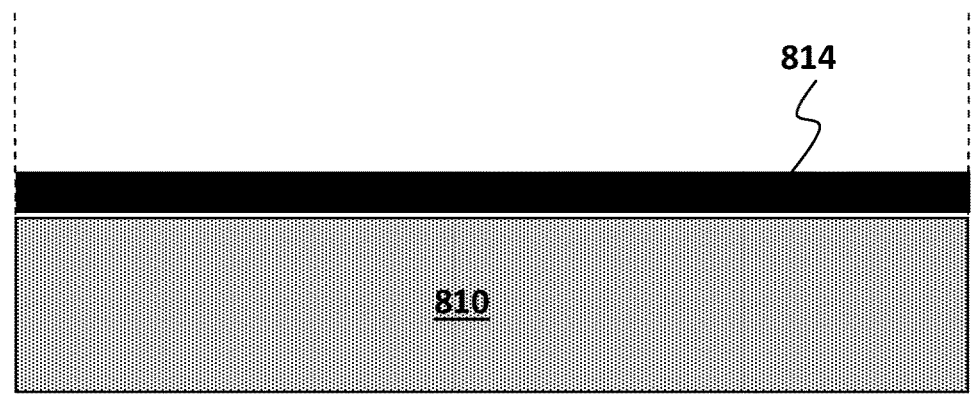
Figure 11A:
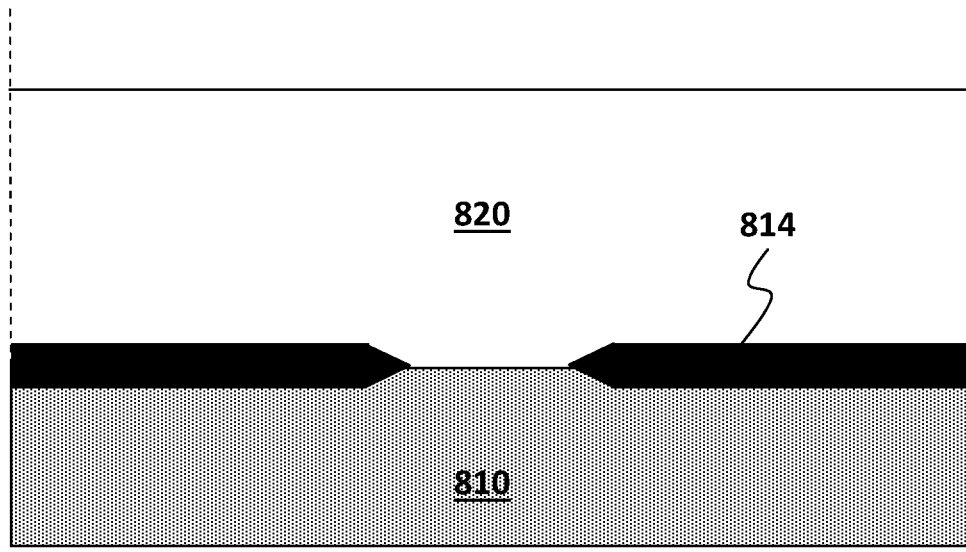
Figure 11B:
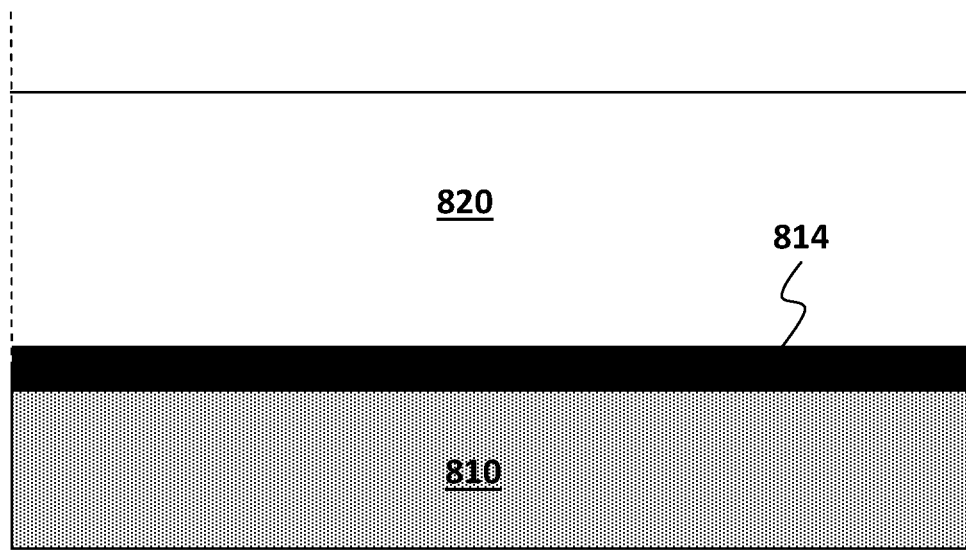

FIGS. 8AA'-29AA' and FIGS. 8BB'-29BB' illustrate a process of fabricating a trench MOSFET in the A-A' and B-B' cross-sections in FIG. 7 respectively. In FIGS. 8AA' and 8BB', the process uses a semiconductor substrate 810 of a first conductivity as a starting material. In some embodiments, the substrate 810 can be a heavily doped N type (N+) silicon wafer. A thin epitaxial layer (EPI) 812 is then deposited on the N+ substrate 810. In some embodiment, the EPI 812 is a lightly-doped N-type layer of silicon. In FIGS. 9AA' and 9BB', a buried layer mask 819 is applied on the EPI layer 812, followed by an implant of a heavily-doped N type impurity (N+) to form a buried layer 814. As shown in FIG. 9AA', a portion of the EPI 812 is covered by the buried layer mask 819 to define the location of an undulation. In FIGS. 10AA' and 10BB, the impurity is then driven by, e.g., annealing. It is noted that the portion of the EPI 812 covered by the buried layer mask 819 is left exposed after the annealing process and removal of the buried layer mask 819 as shown in FIG. 10AA'. In the next step, a thick EPI layer 820 of the same conductivity type as the substrate 810 is provided over the substrate 810 as shown in FIGS. 11AA' and 11BB'. In some embodiments, the thick EPI layer 820 is a lightly doped N type layer. In some implementations, the thickness of the thick EPI layer 820 may be between about 1 μm and about 3 μm. As shown in FIG. 11AA', the masking of the buried layer implant in the above step leads to a thicker and deeper region of the EPI layer 820 in the portion that is previously covered by the buried layer mask 819, and thinner and shallower regions in the portions that are not covered by the buried layer mask 819. The thicker and deeper region of the EPI layer 820 forms a first undulation.

Figure 12A:
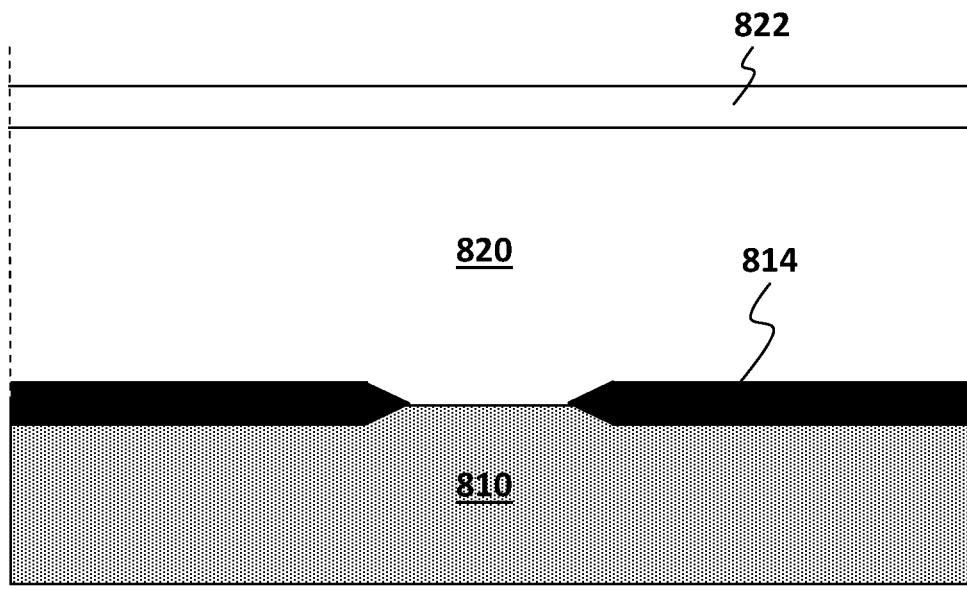
Figure 12B:
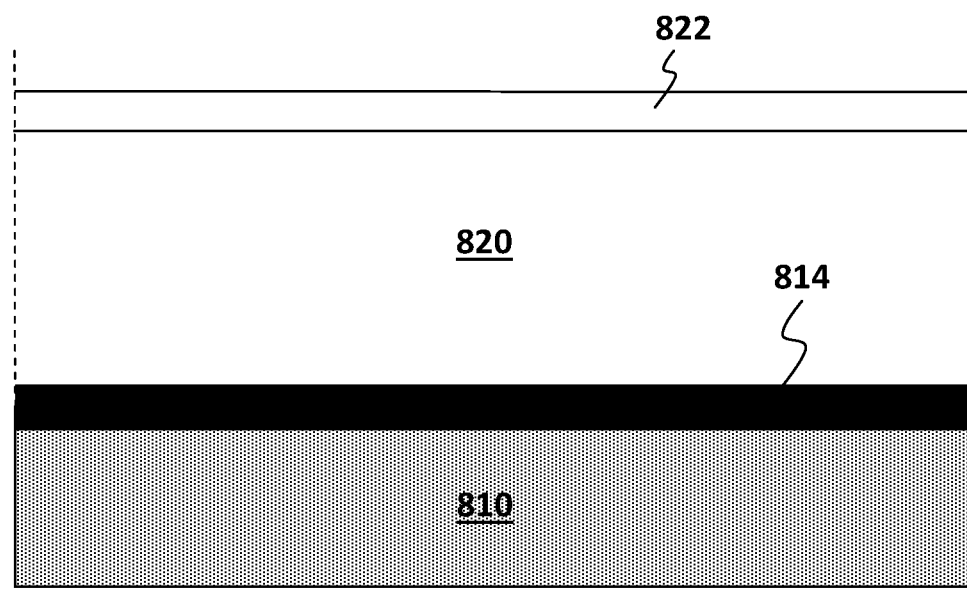
Figure 13A:
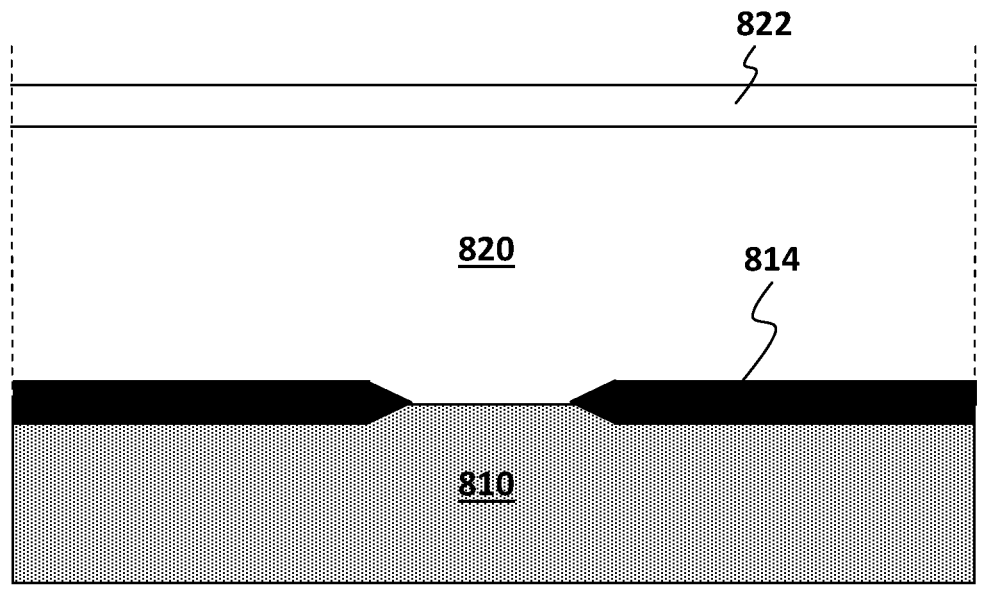
Figure 13B:
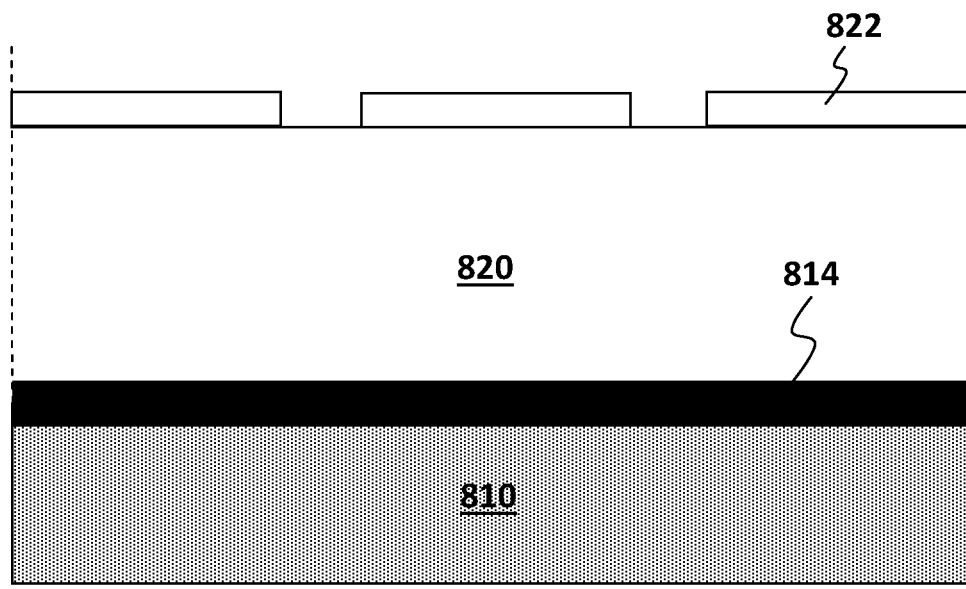
Figure 14A:
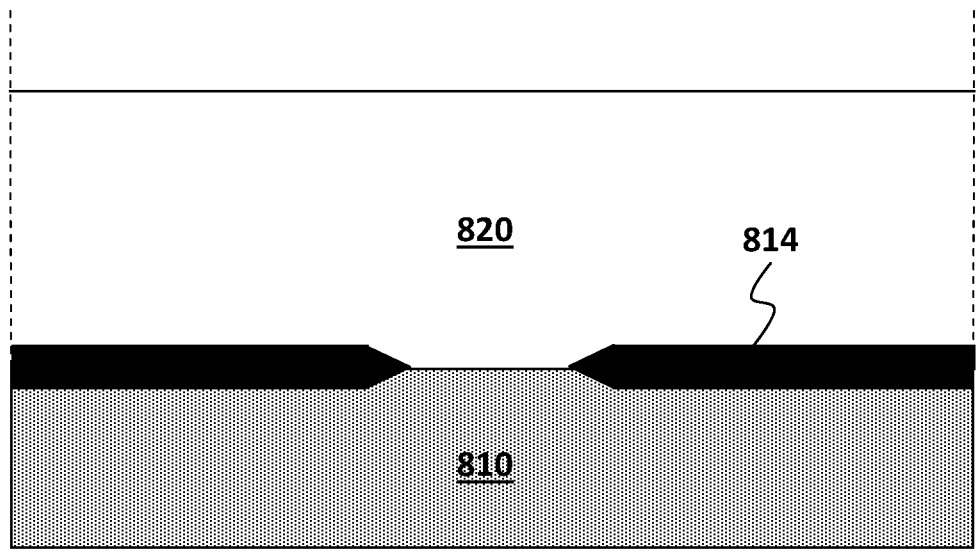
Figure 14B:
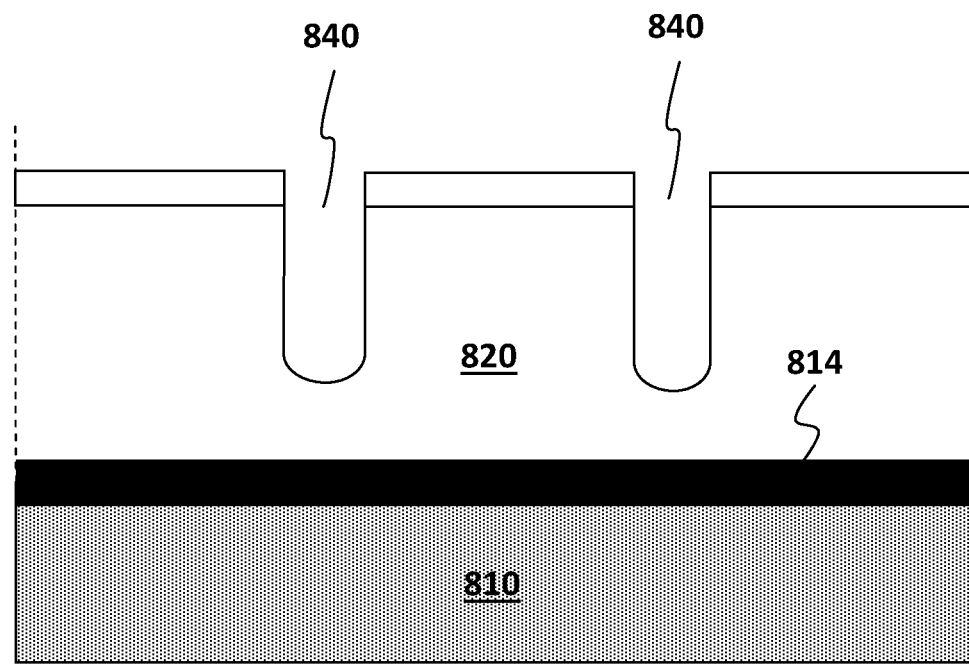

In FIGS. 12AA' and 12BB', an insulating layer 822 is provided over the EPI layer 820. In some embodiment, the insulating layer 822 is an oxide layer. A photoresist (not shown) is then applied on the insulating layer 822 and patterned to define the gate trenches. The patterned photoresist includes openings at locations of the gate trenches. As shown in FIGS. 13AA' and 13BB', an etching process is performed to etch away portions of the insulating layer 822 that are exposed to an etchant through openings in the photoresist. After the photoresist is removed, the remaining portions of the insulating layer 822 act as a mask and corresponding portions of the underlying EPI layer 820 are etched down to form the gate trench 840 as shown in FIGS. 14AA' and 14BB'. The remaining portions of the insulating layer 822 are then removed.

Figure 15A:
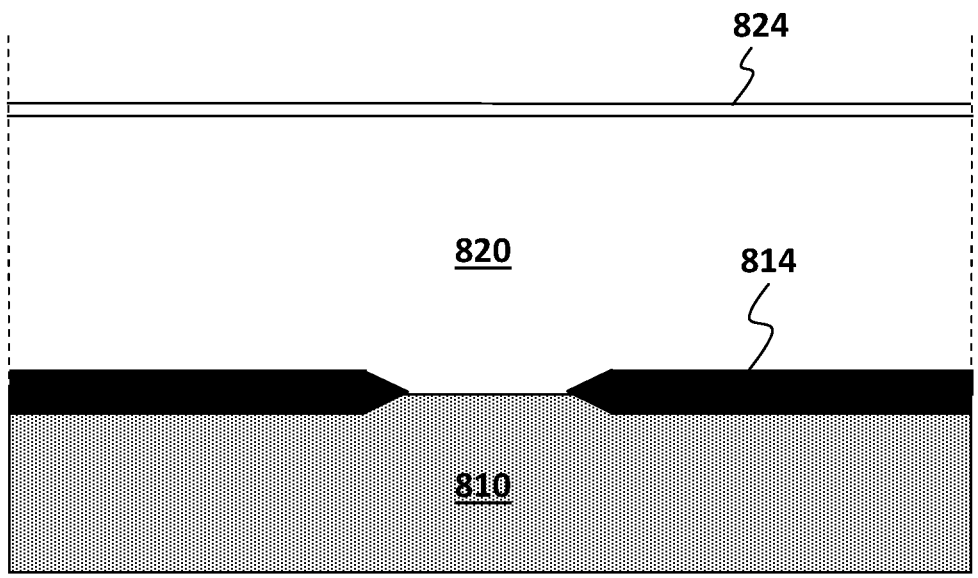
Figure 15B:
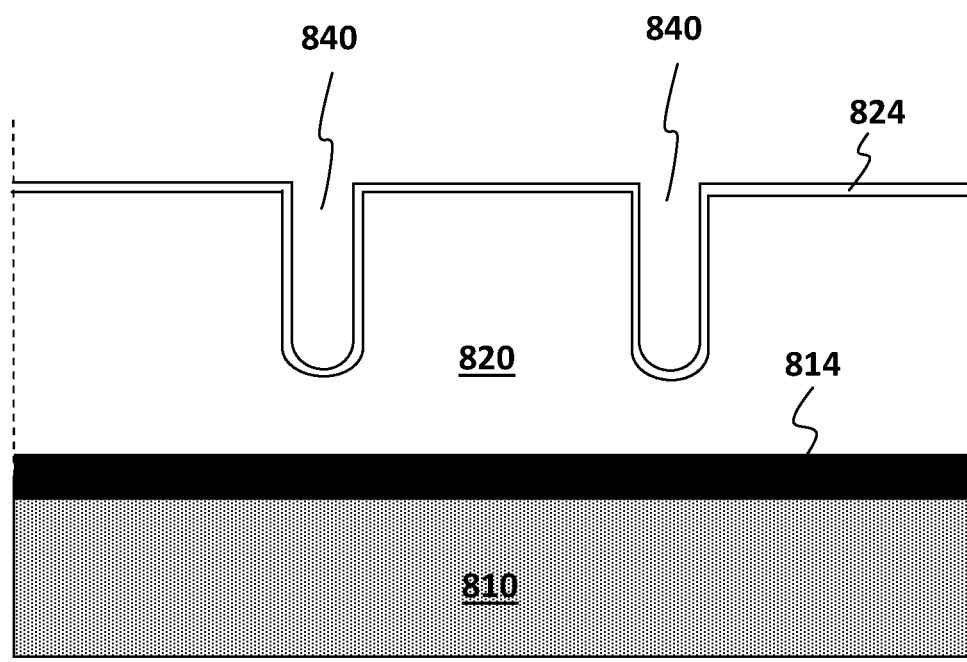
Figure 16A:
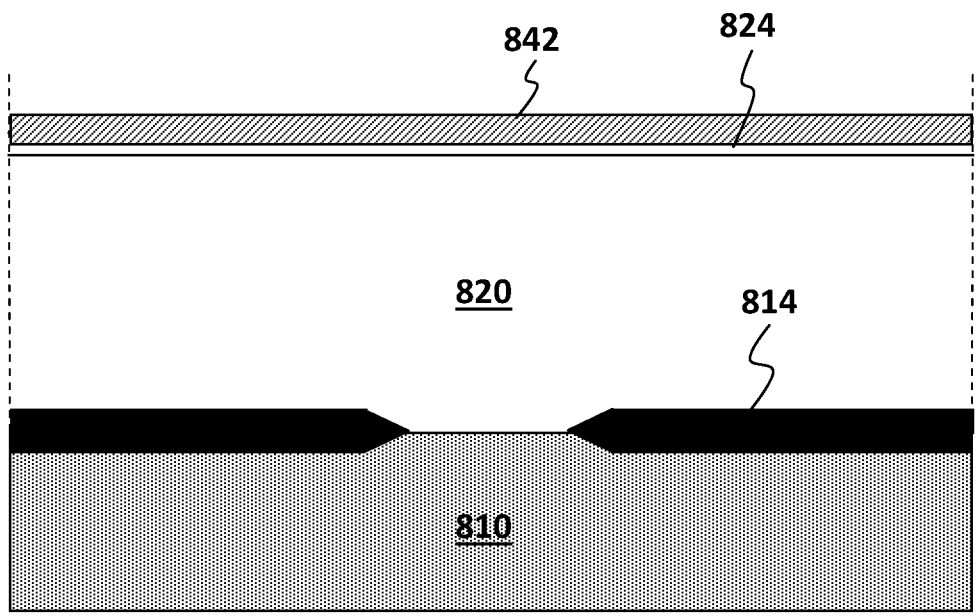
Figure 16B:
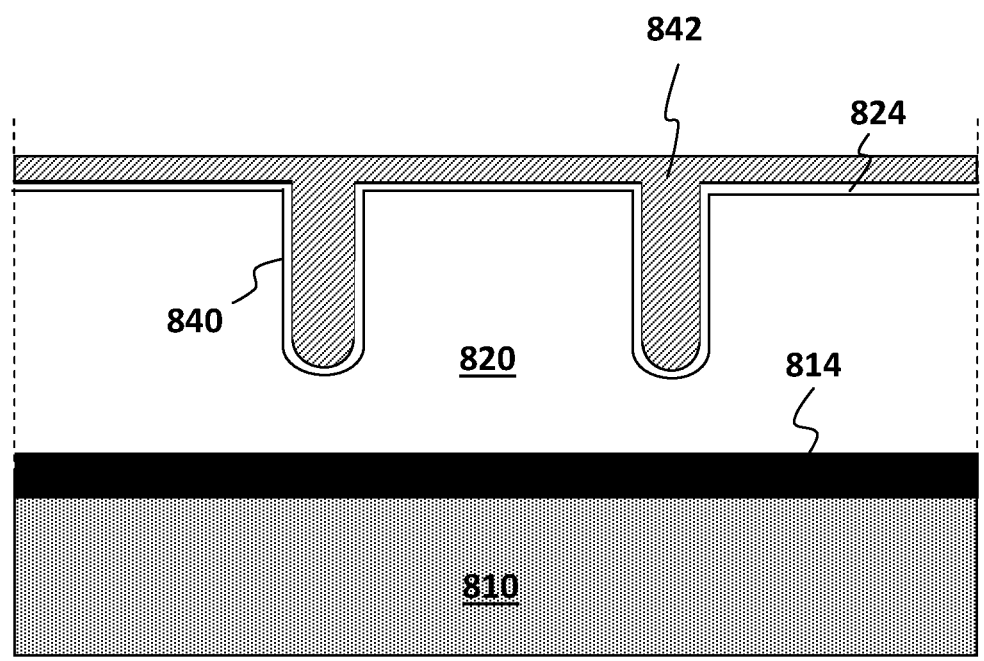
Figure 17A:
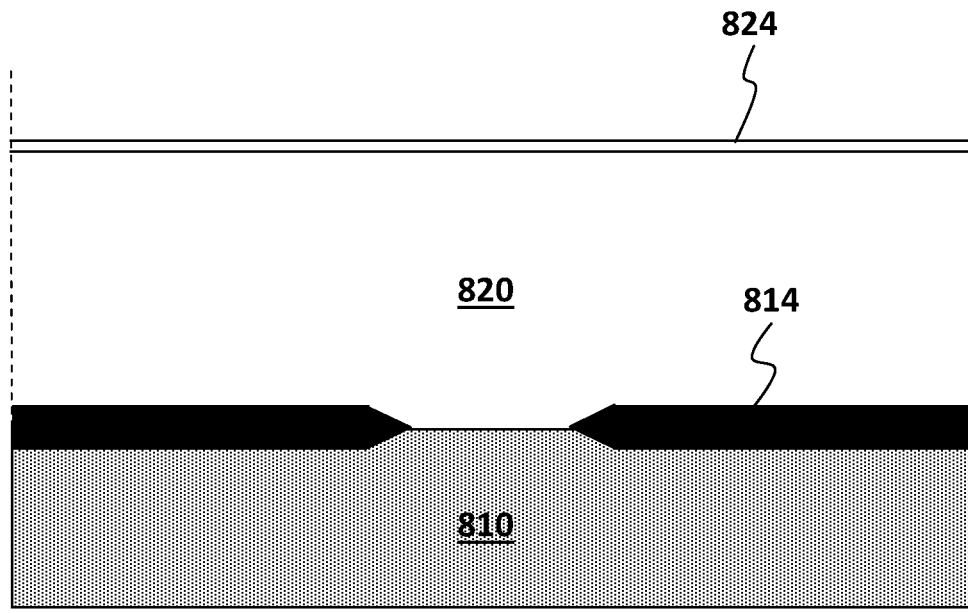
Figure 17B:
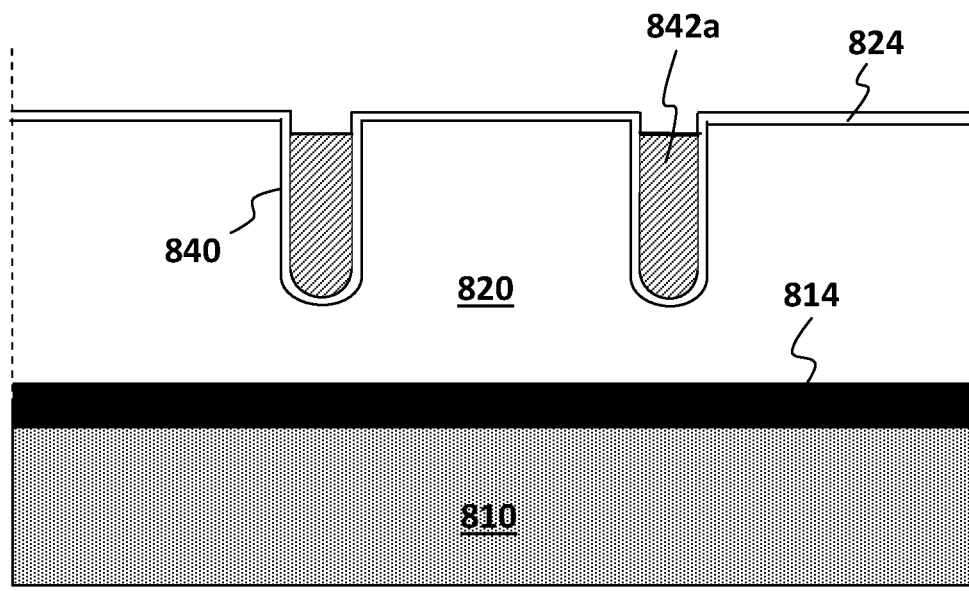
Figure 18A:
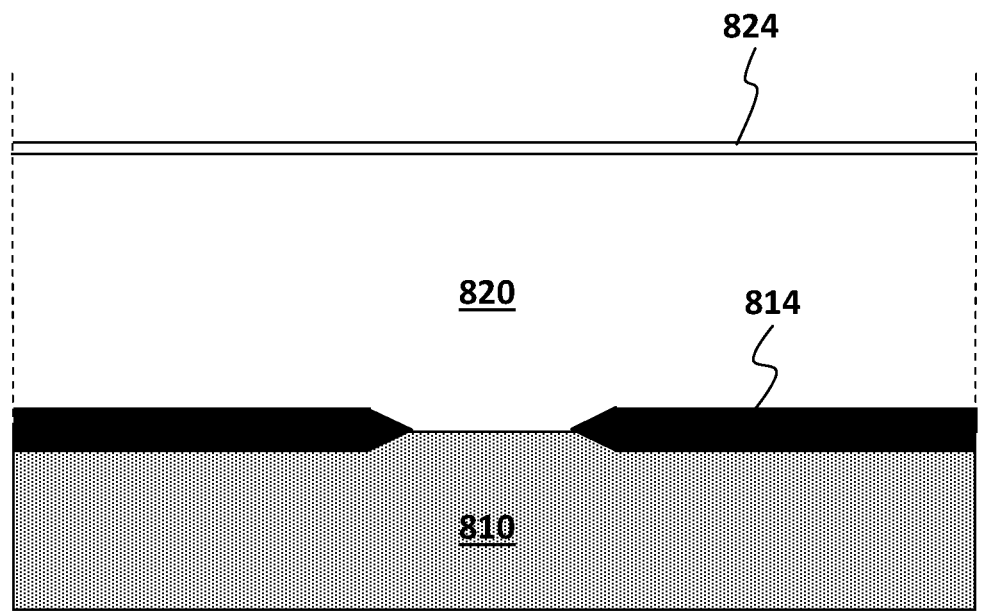
Figure 18B:
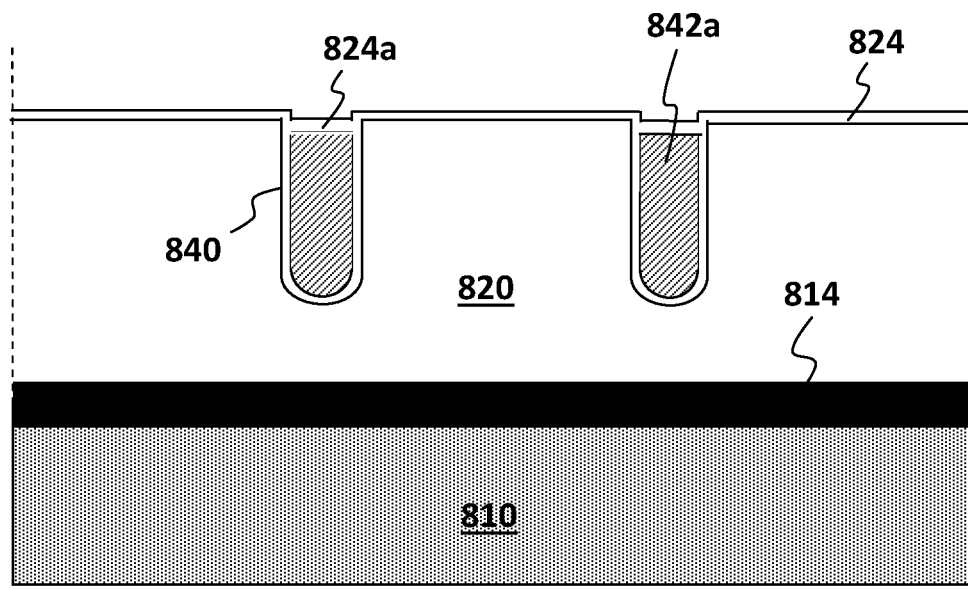

Next, a sacrificial oxide layer (not shown) may be grown and then removed to improve the silicon surface. An insulating layer (e.g., gate oxide) 824 is then formed over the EPI layer 820 and along the inner surface of the gate trenches 840 as shown in FIGS. 15AA' and 15BB'. In FIGS. 16AA' and 16BB', a conductive material 842 is deposited over the gate oxide layer 824. In some embodiments, the conductive material can be in-situ doped or undoped polysilicon. The conductive material 842 is then etched back forming the gate electrode 842a as shown in FIGS. 17AA' and 17BB'. An annealing process is then taken place in FIGS. 18AA' and 18BB'. As shown in FIG. 18BB', a thin layer of oxide 824a is formed on top of the gate electrode 842a by adding a little oxygen to the annealing recipe.

Figure 19A:
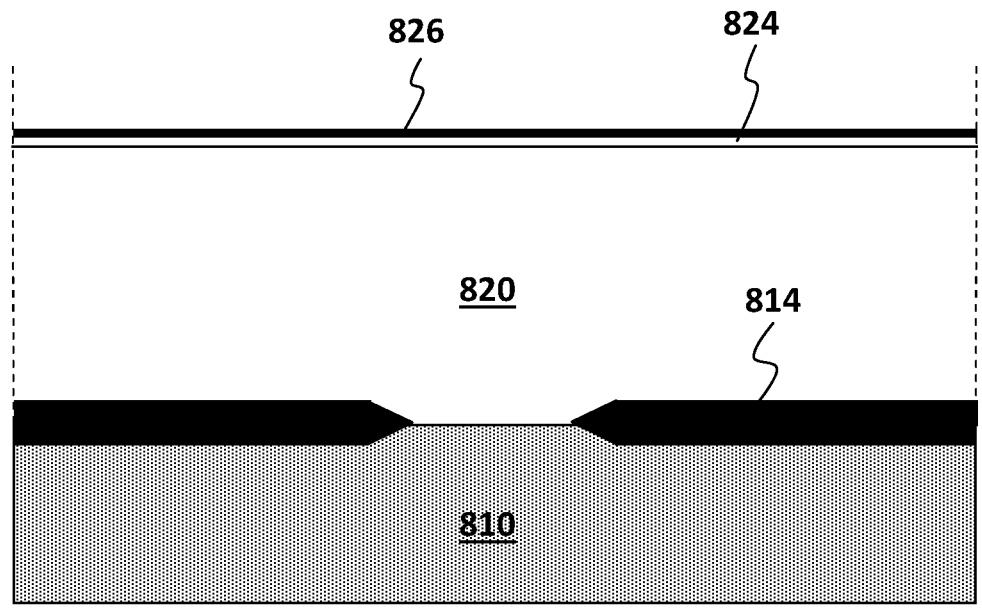
Figure 19B:
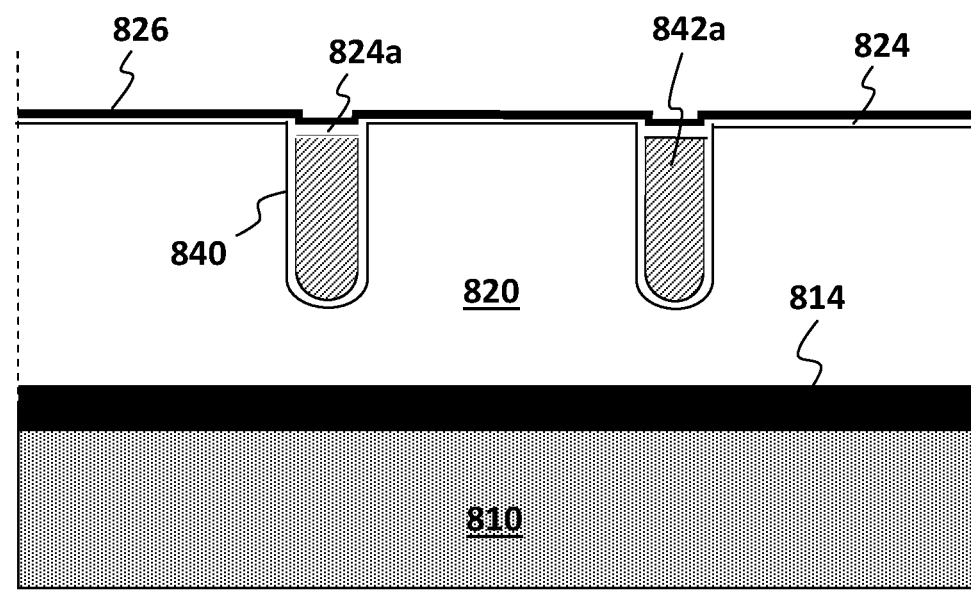
Figure 20A:
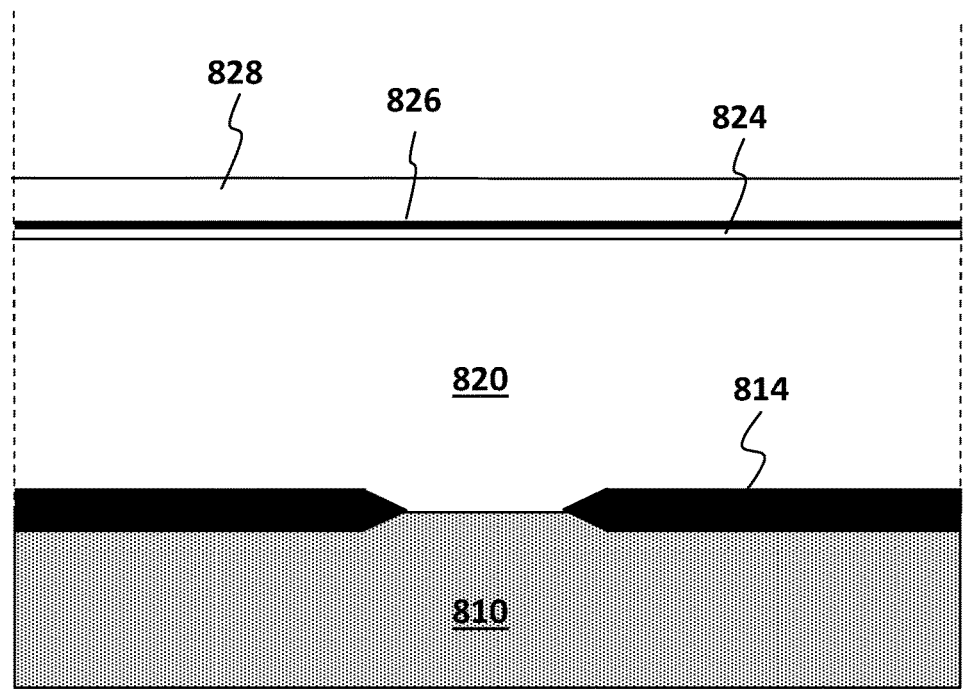
Figure 20B:
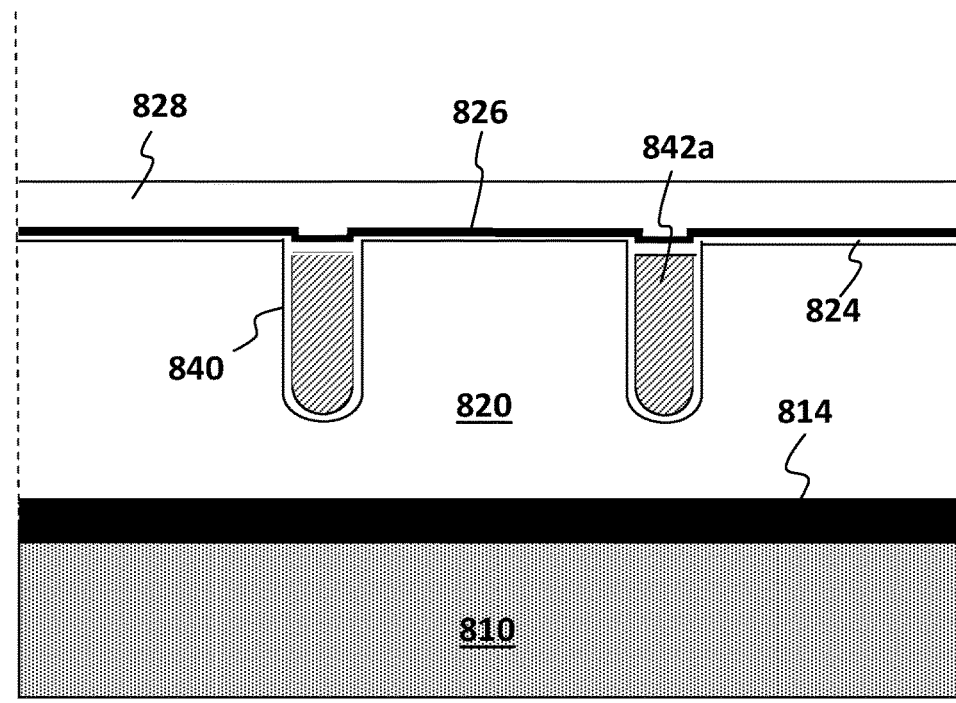

In FIGS. 19AA' and 19BB', a thin layer of a first insulating material 826 is deposited over the gate oxide layer 824. In some embodiments, the thickness of the thin layer of the first insulating material 826 lies in a range of 200 Å to 500 Å. In FIGS. 20AA' and 20BB', a layer of a second insulating material 828 is deposited over the thin layer of the first insulating material 826. In some embodiments, the thickness of the layer of the second insulating material 828 is about 500 Å to 1000 Å. The thin layer 826 and the layer 828 are of two different insulating materials, each resistant to an etch process that etches the other. That is, the thin layer of the first insulating material 826 is resistant to an etch process that etches the layer of the second insulating material 828 and vice versa. Thus, the thin layer of the first insulating material 826 may form an etch stop for subsequent etch on the layer of the second insulating material 828. In some embodiments, the thin layer 826 is a nitride layer, and the layer of a second insulating material 828 is an oxide layer. The insulating material 828 is treated such that the edges of the opening are sloped or tapered after etching. For example, the surface can be doped or implanted to increase the etch rate to enhance undercutting for wet etching. If plasma etching is used, oxygen can be added during the etch to erode the photoresist to create the sloped edge. Hence, the slope of the opening can be tailored to the desired angle.

Figure 21A:
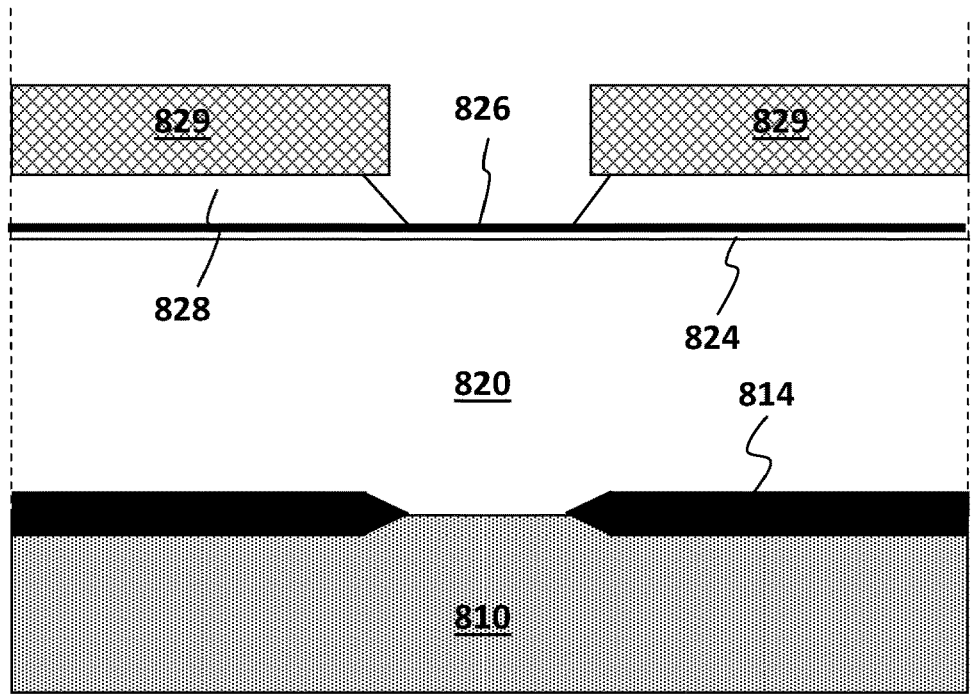
Figure 21B:
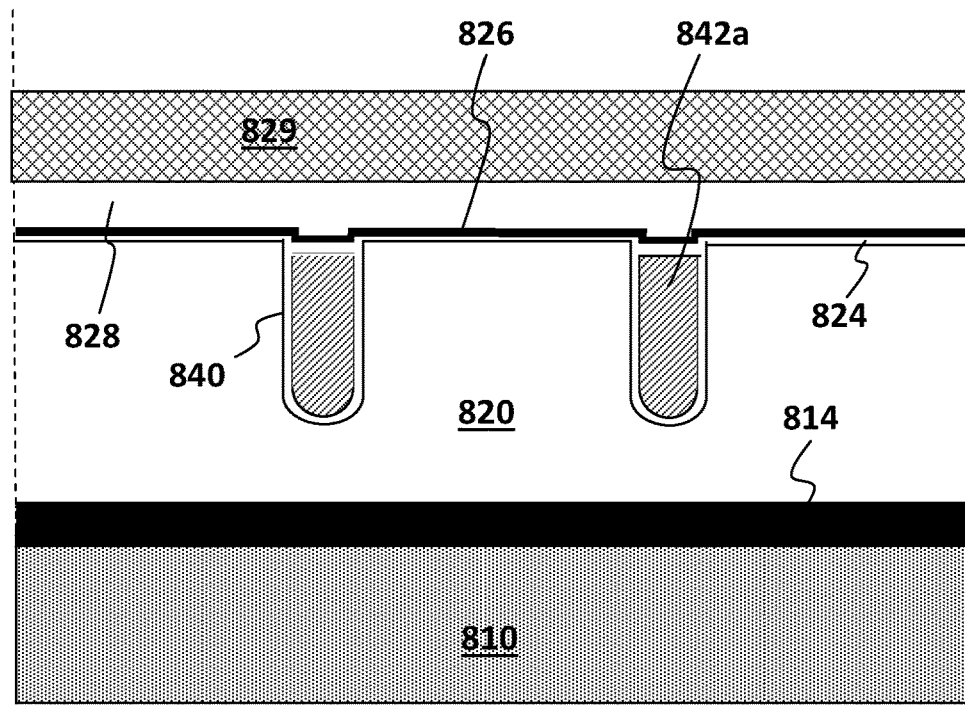
Figure 22A:
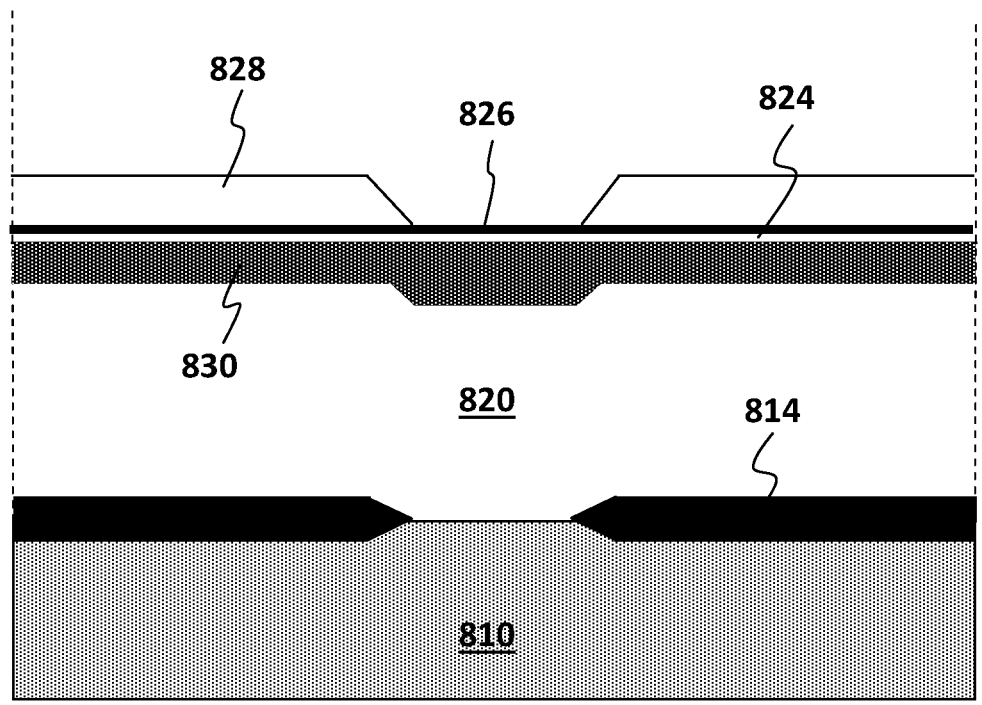
Figure 22B:
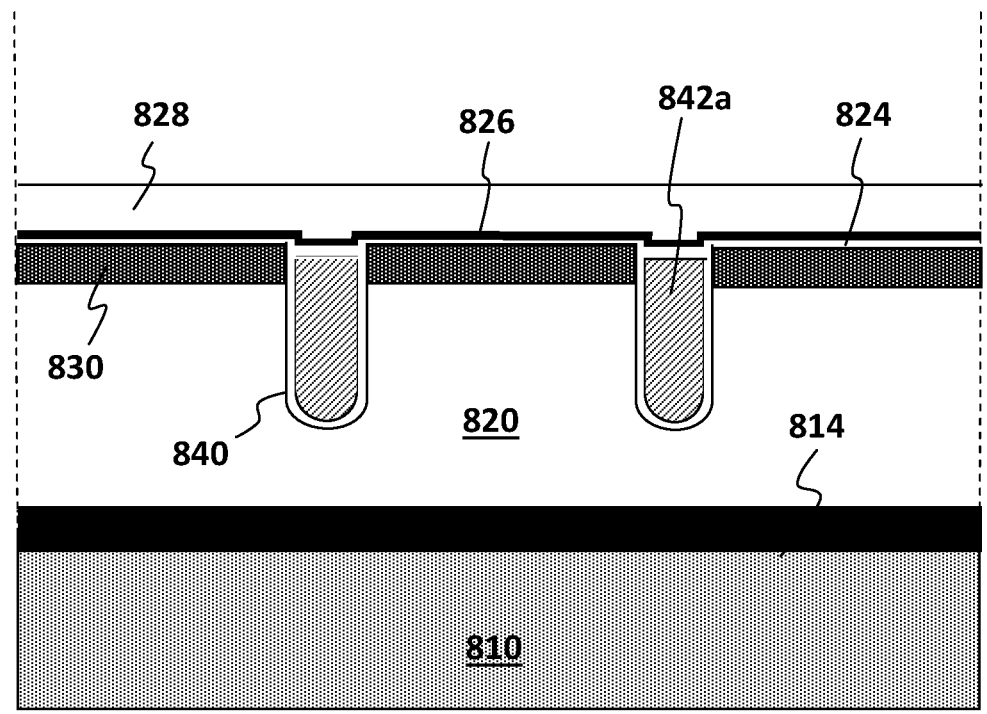
Figure 23A:
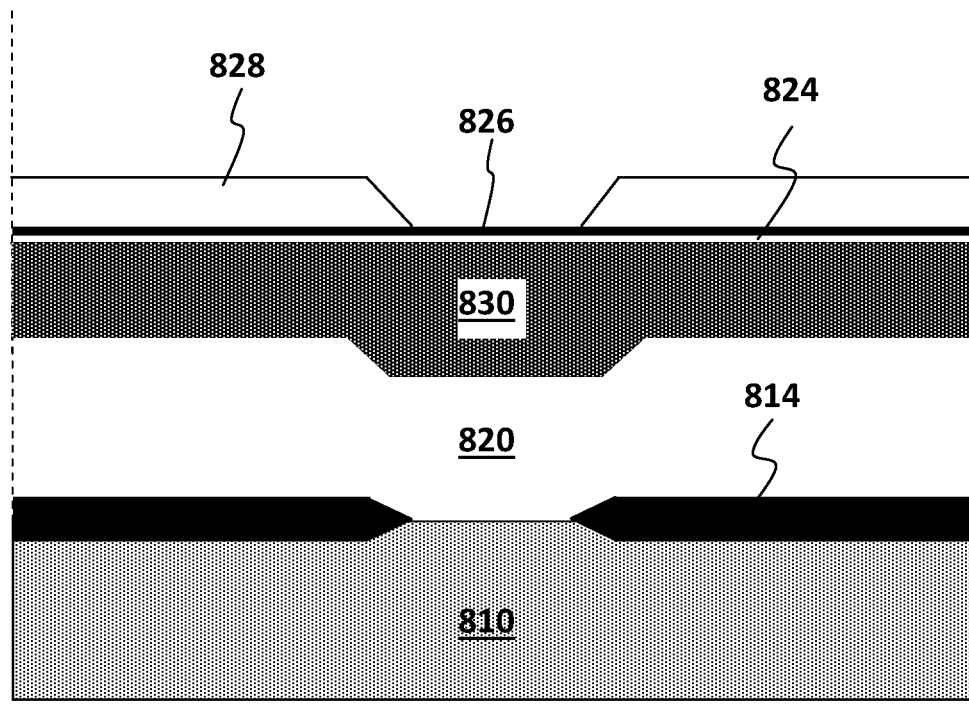
Figure 23B:
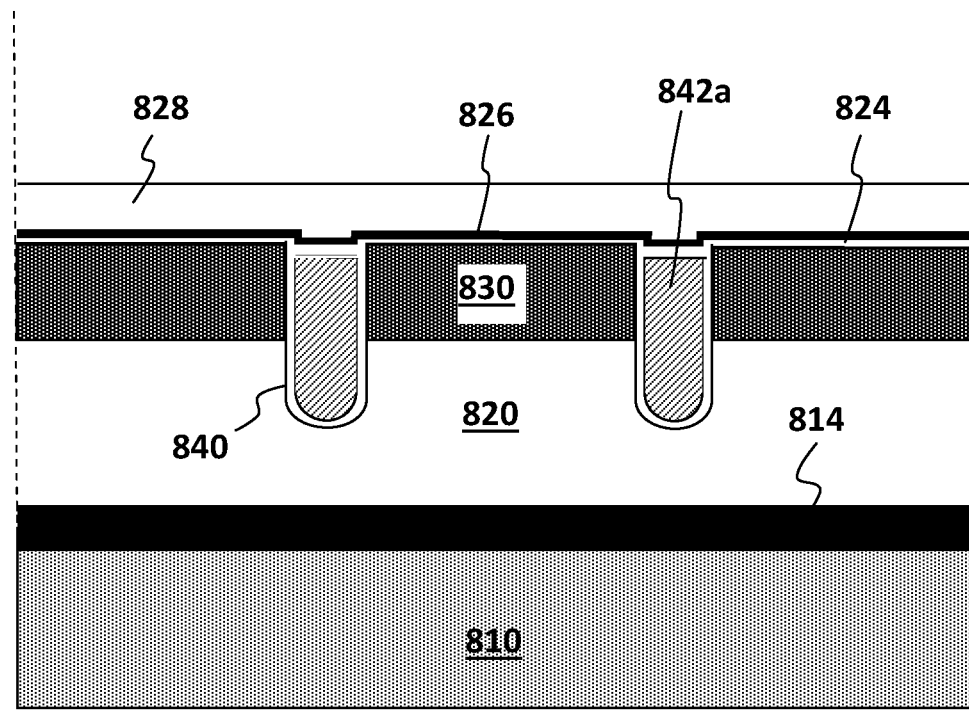

Next, body implant and body diffusion take place. In FIGS. 21AA' and 21BB', a body mask 829 is applied for body implantation. It is noted that the body mask 829 has an opening shown in the A-A' plane but not in the B-B' plane. Dopants are implanted into the EPI layer 820 through the oxide layer 828 and the thin nitride layer 826 as shown in FIGS. 22AA'-22BB'. The dopant ions are of the opposite conductivity type to the doping of the substrate 810. In some embodiments, the dopant ions can be Boron ions for an N-channel device. In some embodiments, Phosphorous or Arsenic ions can be used for P-channel devices. Since the oxide layer 828 and the nitride layer 826 under the mask opening is not thick, the dopants can be implanted deeper into the EPI layer 820 under the opening to form the second undulation. The angle of the undulation follows the slope of the oxide opening. Heat is then applied to activate dopant atoms and drive dopant diffusion to form a body region 830 as shown in FIGS. 23AA' and 23BB'.

Figure 24A:
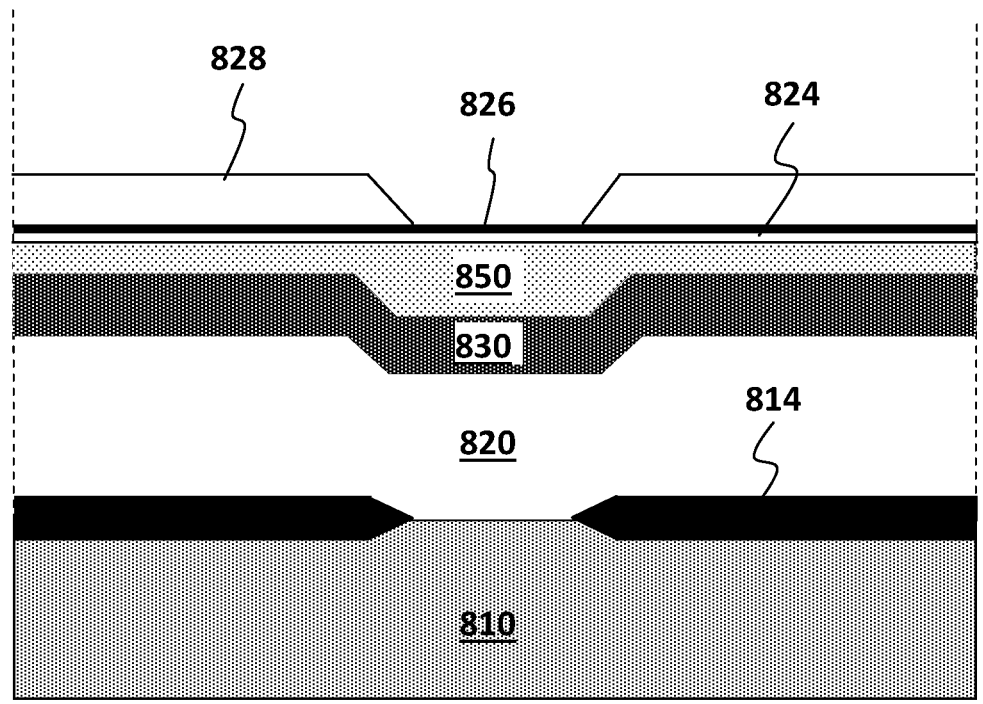
Figure 24B:
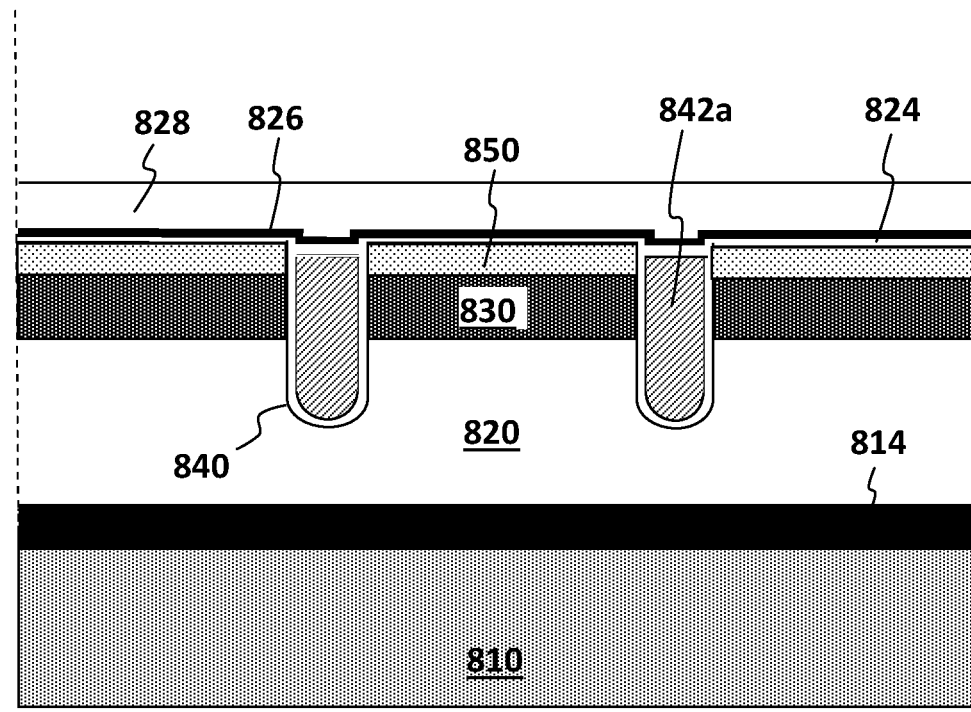
Figure 25A:
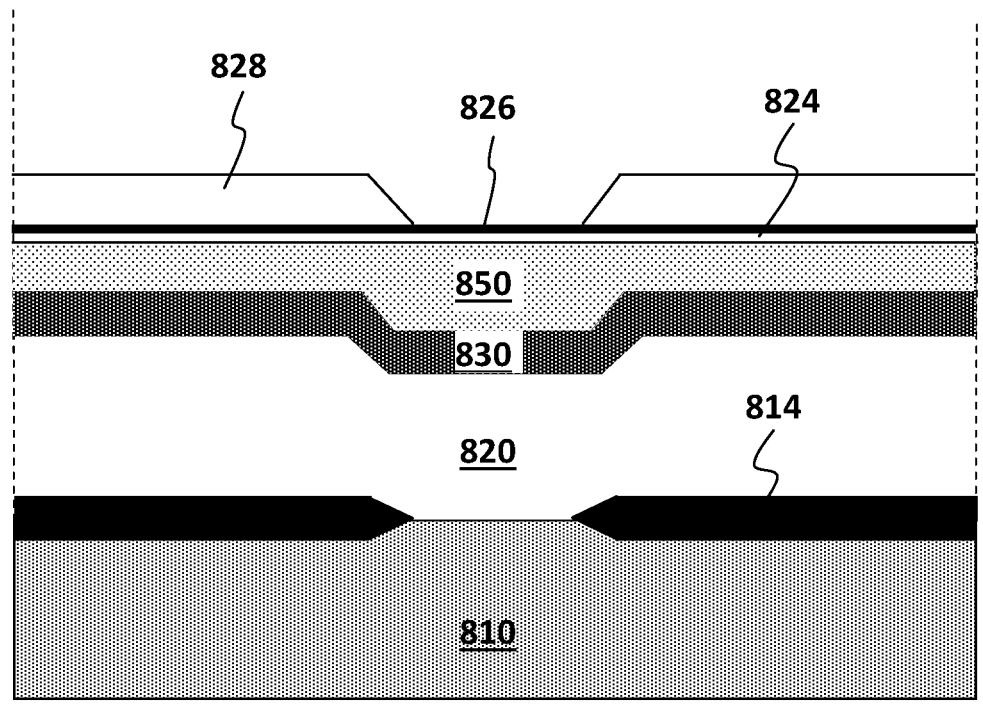
Figure 25B:
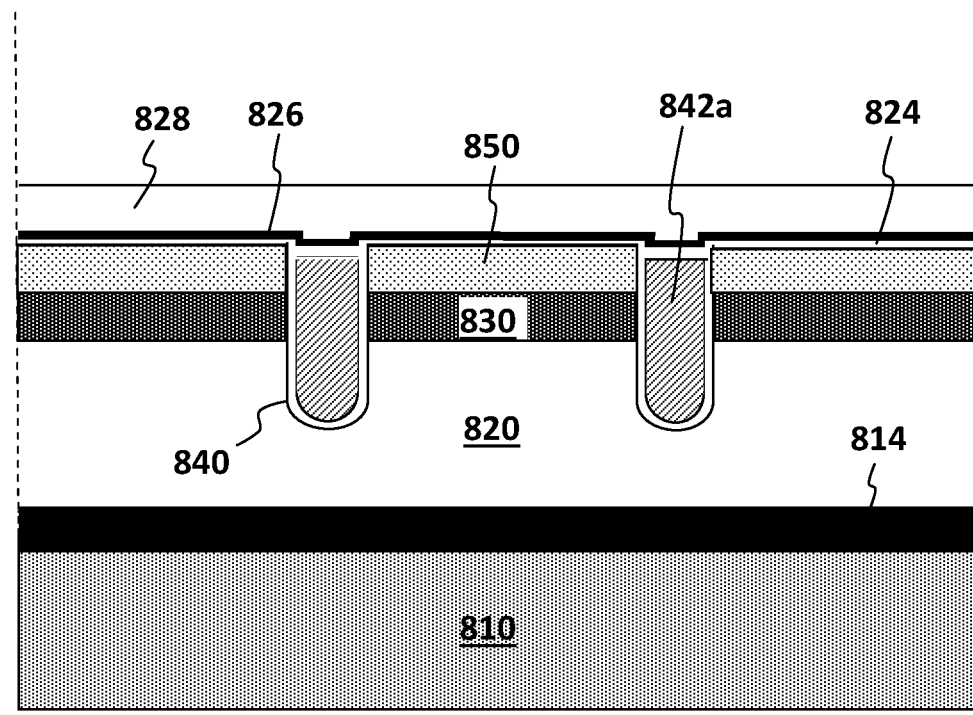
Figure 26A:
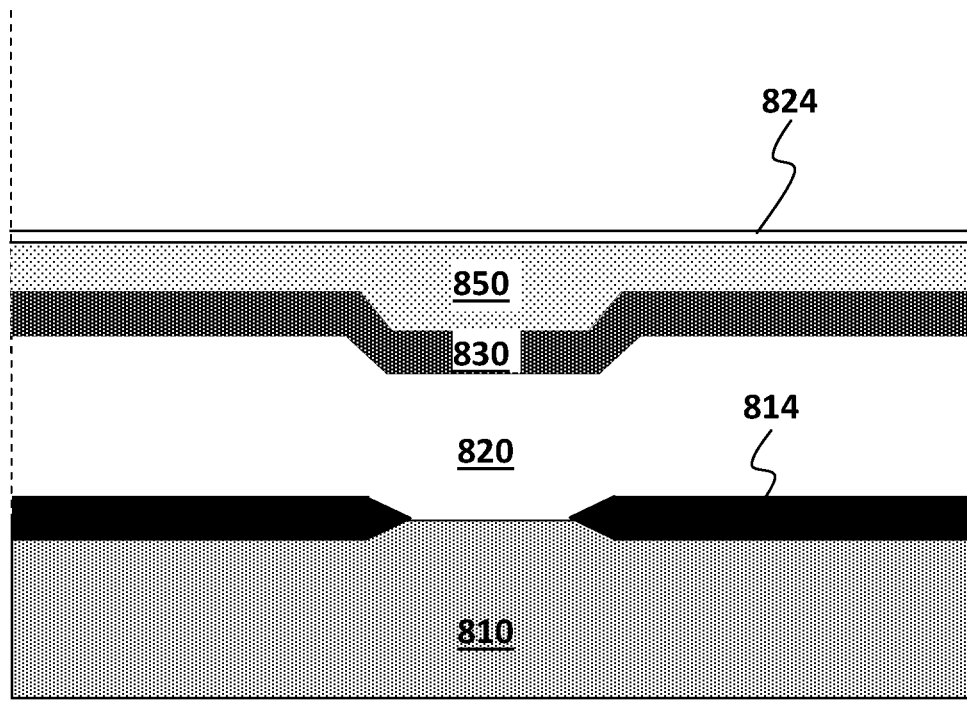
Figure 26B:
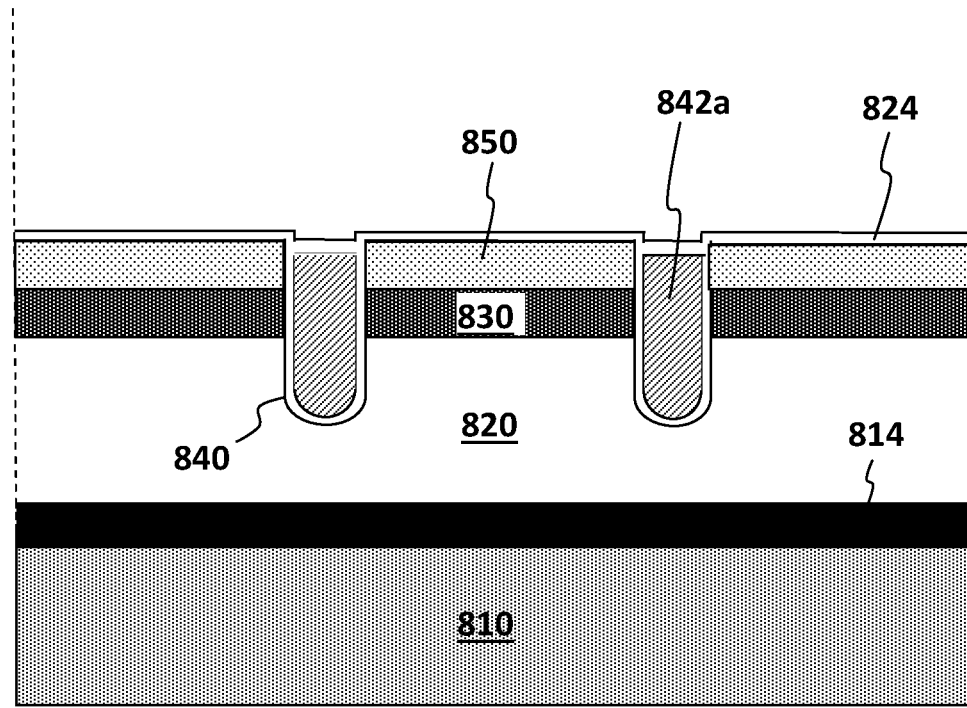

After forming the body region 830, source implant and source diffusion take place. First, a source implant is carried out through the same opening as shown in FIGS. 24AA' and 24BB'. The dopant ions are of the same conductivity type to the doping of the substrate 810. In some embodiments, Arsenic ions can be implanted for an N-channel device. Alternatively, Boron ion can be implanted for a P-channel device. Since the oxide layer 828 and the nitride layer 826 under the mask opening is not thick, the dopants can be implanted deeper in the body region 830 under the opening to form the third undulation. In FIGS. 25AA' and 25BB', standard diffusion process is performed to form the source region 850 in the body region 830. Next, the oxide layer 828 and the nitride layer 826 are removed in FIGS. 26AA' and 26BB' according to a standard process.

Figure 27A:
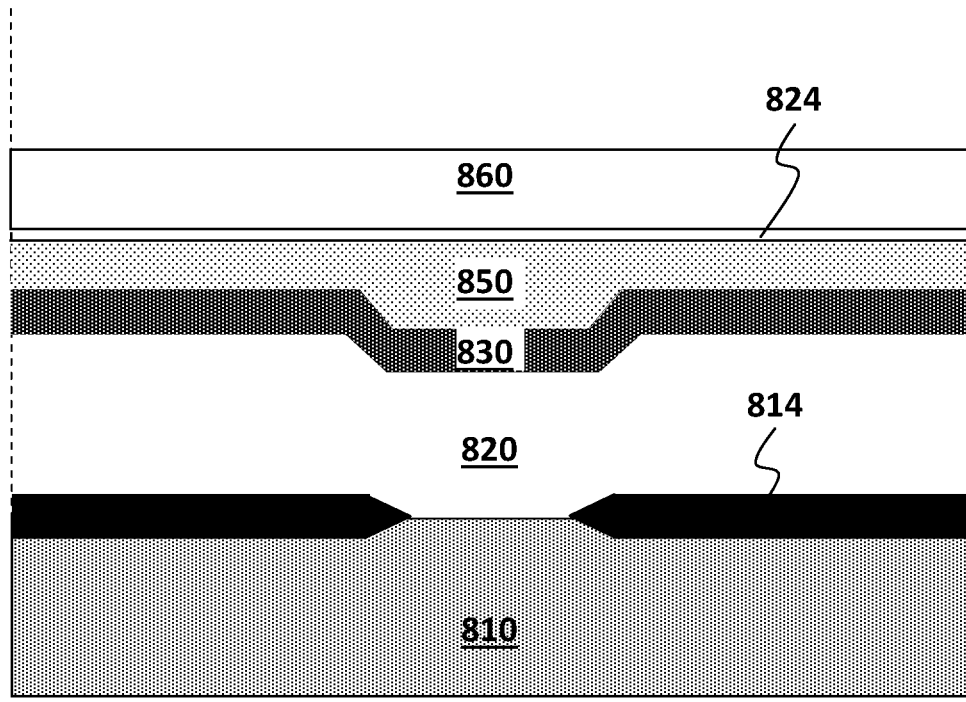
Figure 27B:
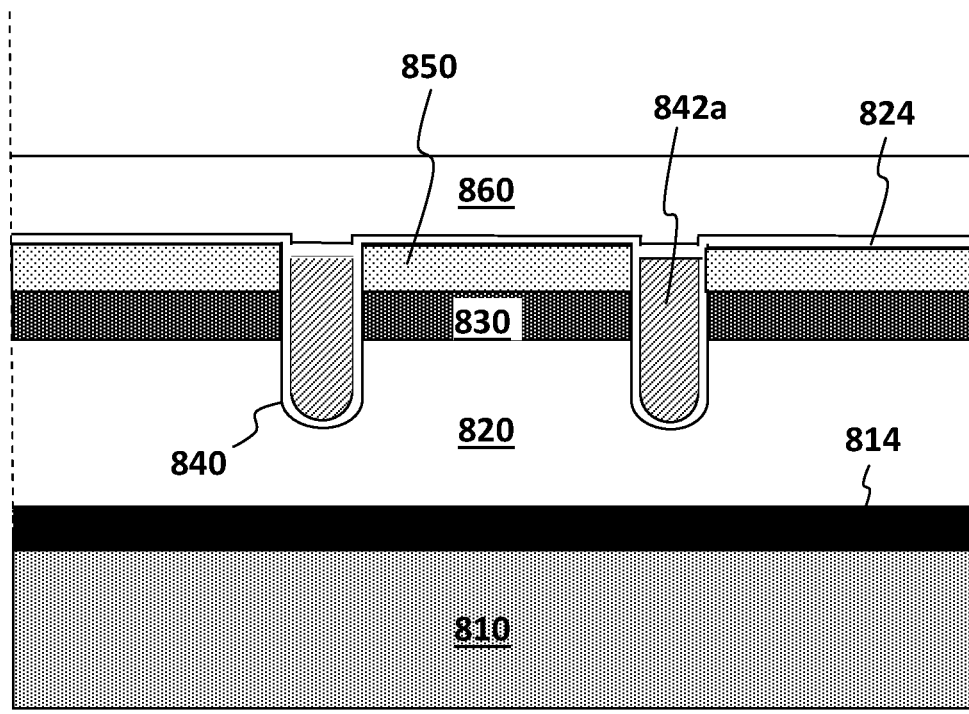

A dielectric layer 860, such as an oxide, can be deposited over the gate oxide layer 824 as shown in FIGS. 27AA'-27BB'. In some embodiments, the dielectric layer 860 is formed by a low temperature oxide followed by a layer of Borophosphorosilicate Glass (BPSG).

Figure 28A:
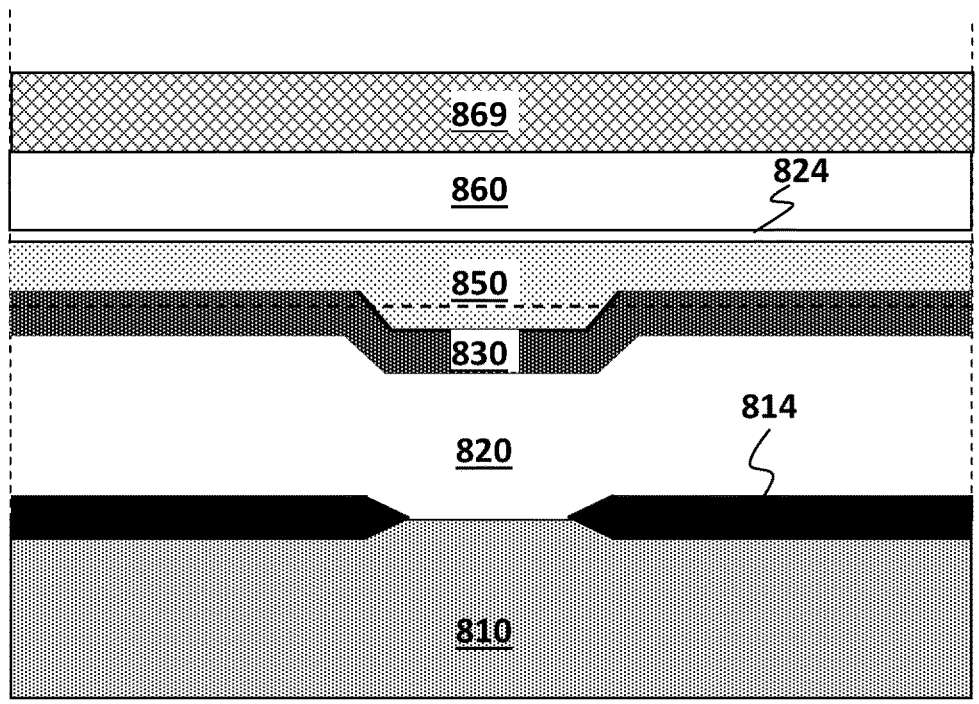
Figure 28B:
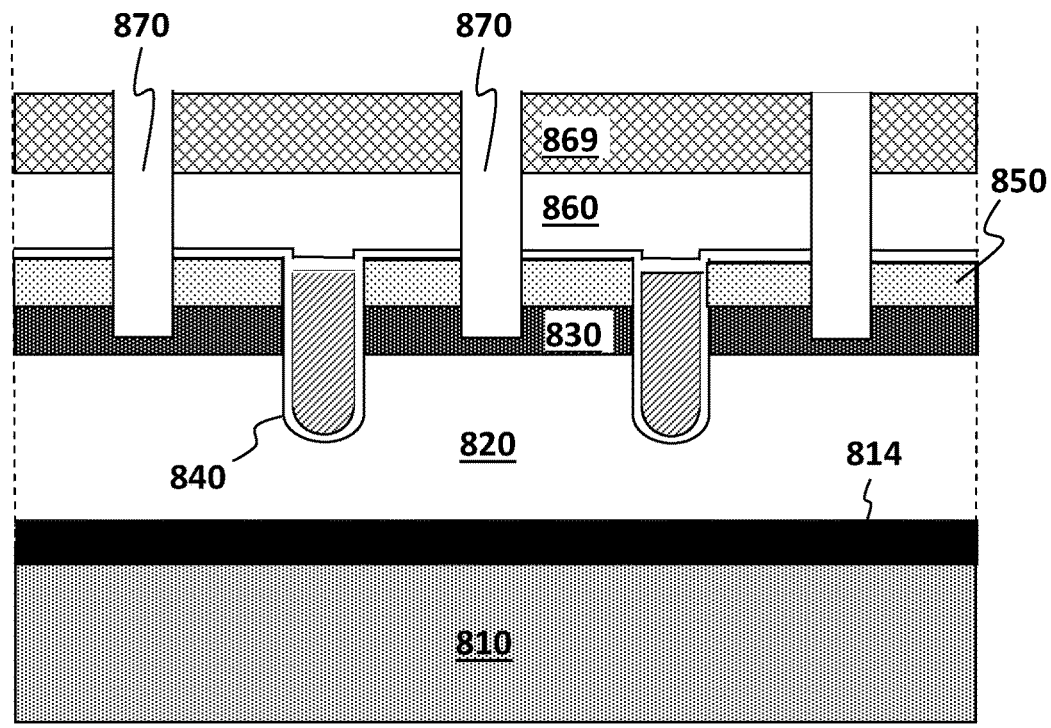
Figure 29A:
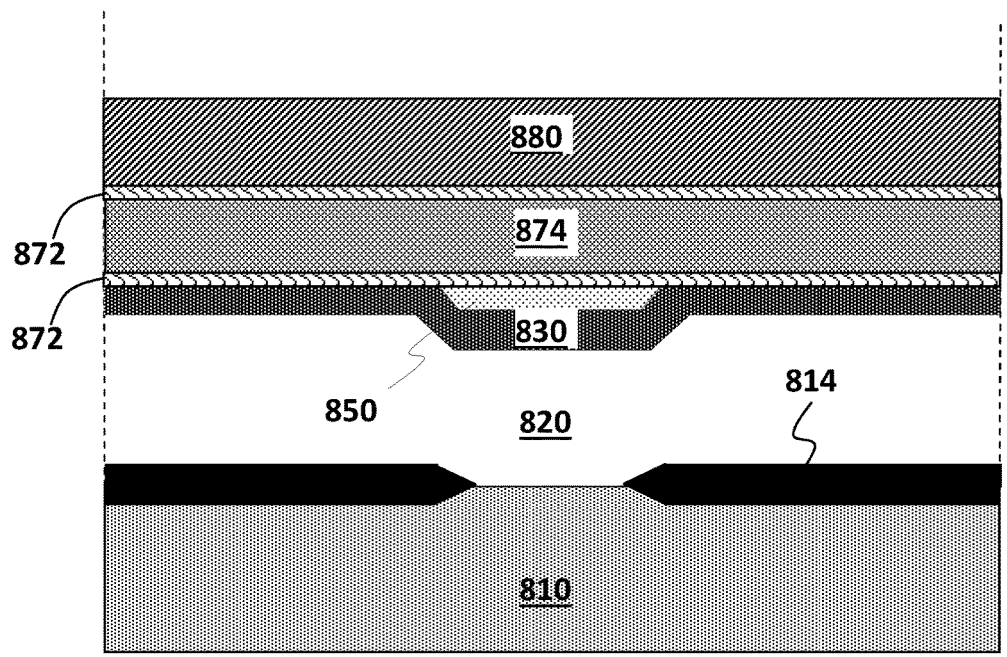
Figure 29B:
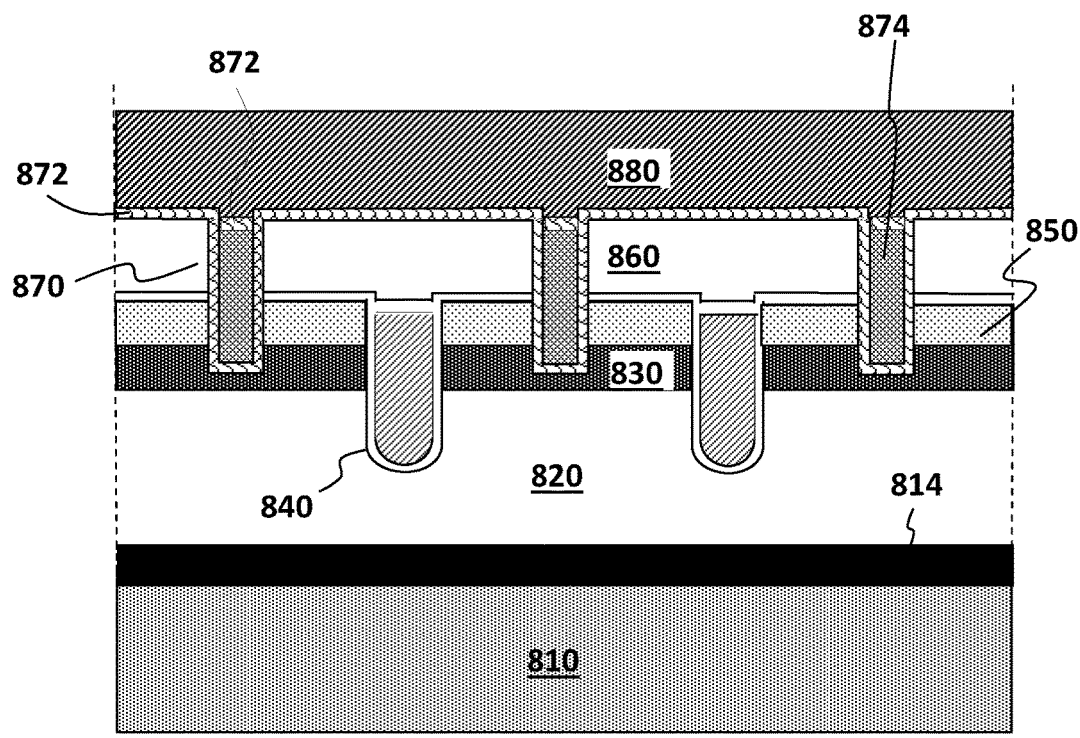

A contact photoresist 869 is then applied on the dielectric layer 860 with a pattern that has an opening at the locations of contact trenches. In FIG. 28AA'-28BB', an etch process is performed to remove the uncovered portions of the dielectric layer 860 and form contact trenches 870 in the body region 830. In FIGS. 29AA'-29BB', a barrier metal 872 is first lined with the inner surface of the contact trenches 870. In some embodiments, the barrier metal 872 may be Titanium (Ti) and Titanium Nitride (TiN). A conductive material, such as Tungsten (W), may be blanket deposited in the contact trenches 870 followed by an etch back up to the surface of the dielectric layer 860 to form a conductive plug 874. Finally, a metal layer 880 is deposited on the top as shown in FIGS. 29AA'-29BB'. In some embodiments, the metal layer 880 may be Aluminum (Al) or Aluminum Copper (AlCu).

While the above is a complete description of the preferred embodiments of the present invention, it is possible to use various alternatives, modifications, and equivalents. Therefore, the scope of the present invention should be determined not with reference to the above description but should, instead be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for." Any element in a claim that does not explicitly state "means for" performing a specified function, is not to be interpreted as a "means" or "step" clause as specified in 35 USC § 112, ¶6.

What is claimed is:

1. A trench MOSFET device, comprising:
   a lightly doped epitaxial layer of a first conductivity type provided on a heavily doped semiconductor substrate of the first conductivity type;
   a gate trench filled with a conductive material extending into the lightly doped epitaxial layer;
   a body region of a second conductivity type opposite to the first conductivity type provided in portions of the lightly doped epitaxial layer, wherein the body region have a first undulation along a channel width direction; and
   a source region of the first conductivity type provided in top portions of the body region, wherein the source region have a second undulation along the channel width direction above the first undulation, wherein a channel width of the MOSFET device is increased with introduction of the first and second undulations wherein the lightly doped epitaxial layer has a third undulation along a channel width direction of the MOSFET device with a depth extending into the semiconductor substrate deeper than other portions of the lightly doped epitaxial layer.

2. The device of claim 1, wherein the first conductivity type is an N type and the second conductivity type is a P type.

3. The device of claim 1, wherein the lightly doped epitaxial layer, the body region and the source region have variations in depth along the channel width.

4. The device of claim 1, wherein the first undulation has a depth extending into the lightly doped epitaxial layer deeper than other portions of the body region.

5. The device of claim 1, wherein the second undulation has a depth extending into the body region deeper than other portions of the source region.

6. The device of claim 1, wherein tapered sides of the first and second undulations are at an angle between about 25 degrees and about 90 degrees.

* * * * *